United States Patent
Hanawa et al.

(10) Patent No.: US 9,728,396 B2
(45) Date of Patent: Aug. 8, 2017

(54) SUBSTRATE CLEANING METHOD AND SUBSTRATE CLEANING APPARATUS

(71) Applicant: SCREEN Holdings Co., Ltd., Kyoto (JP)

(72) Inventors: Yosuke Hanawa, Kyoto (JP); Katsuhiko Miya, Kyoto (JP); Yuta Sasaki, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 113 days.

(21) Appl. No.: 14/742,792

(22) Filed: Jun. 18, 2015

(65) Prior Publication Data

US 2016/0074913 A1    Mar. 17, 2016

(30) Foreign Application Priority Data

Sep. 12, 2014  (JP) .................................. 2014-185758

(51) Int. Cl.
  B08B 3/12        (2006.01)
  H01L 21/02       (2006.01)
  C11D 11/00       (2006.01)
  G03F 1/82        (2012.01)
  H01L 21/67       (2006.01)

(52) U.S. Cl.
  CPC .......... H01L 21/02057 (2013.01); B08B 3/12 (2013.01); C11D 11/007 (2013.01); C11D 11/0047 (2013.01); G03F 1/82 (2013.01); H01L 21/67051 (2013.01); B08B 2203/0288 (2013.01)

(58) Field of Classification Search
  None
  See application file for complete search history.

(56) References Cited

U.S. PATENT DOCUMENTS

| | | | | |
|---|---|---|---|---|
| 6,050,276 A | * | 4/2000 | Harada | ..................... B08B 3/02 134/103.3 |
| 2003/0234030 A1 | | 12/2003 | Shibayama | ....................... 134/2 |
| 2004/0003829 A1 | | 1/2004 | Hirae | ............................. 134/1.3 |

FOREIGN PATENT DOCUMENTS

| | | |
|---|---|---|
| JP | 11-300301 | 11/1999 |
| JP | 2004-079990 | 3/2004 |
| JP | 2004-335525 A | 11/2004 |
| JP | 2004-363453 | 12/2004 |

(Continued)

OTHER PUBLICATIONS

Applicant-provided translation of JP2011-077144 by Haguchi et al., published Apr. 14, 2011.*

(Continued)

*Primary Examiner* — Michael Kornakov
*Assistant Examiner* — Ryan Coleman
(74) *Attorney, Agent, or Firm* — Ostrolenk Faber LLP

(57) ABSTRACT

An ultrasonic wave applying liquid is supplied to one principal surface of a substrate while a liquid film of a first liquid being formed on another principal surface of the substrate. The ultrasonic wave applying liquid is obtained by applying ultrasonic waves to a second liquid. Ultrasonic vibration is transmitted to the other principal surface and the liquid film, thereby ultrasonically cleaning the other principal surface. The first liquid has a higher cavitation intensity, which is a stress per unit area acting on the substrate by cavitation caused in the liquid when ultrasonic waves are transmitted to the liquid present on the principal surface of the substrate, than the second liquid.

4 Claims, 22 Drawing Sheets

(56) References Cited

FOREIGN PATENT DOCUMENTS

| | | | |
|---|---|---|---|
| JP | 3974340 B2 | | 9/2007 |
| JP | 2010-027816 | | 2/2010 |
| JP | 2011-077144 | * | 4/2011 |
| JP | 2011-077144 A | | 4/2011 |
| JP | 2013-084667 | | 5/2013 |
| KR | 10-2008-0094539 | | 10/2008 |

OTHER PUBLICATIONS

Office Action issued Mar. 14, 2016 in corresponding Taiwanese Patent Application No. 104113100.
Office Action issued Apr. 20, 2016 in corresponding Korean Patent Application No. 10-2015-0047327.
Korean Notice of Allowance issued Oct. 20, 2016 in corresponding Korean Patent Application No. 10-2015-0047327.

* cited by examiner

F I G. 2
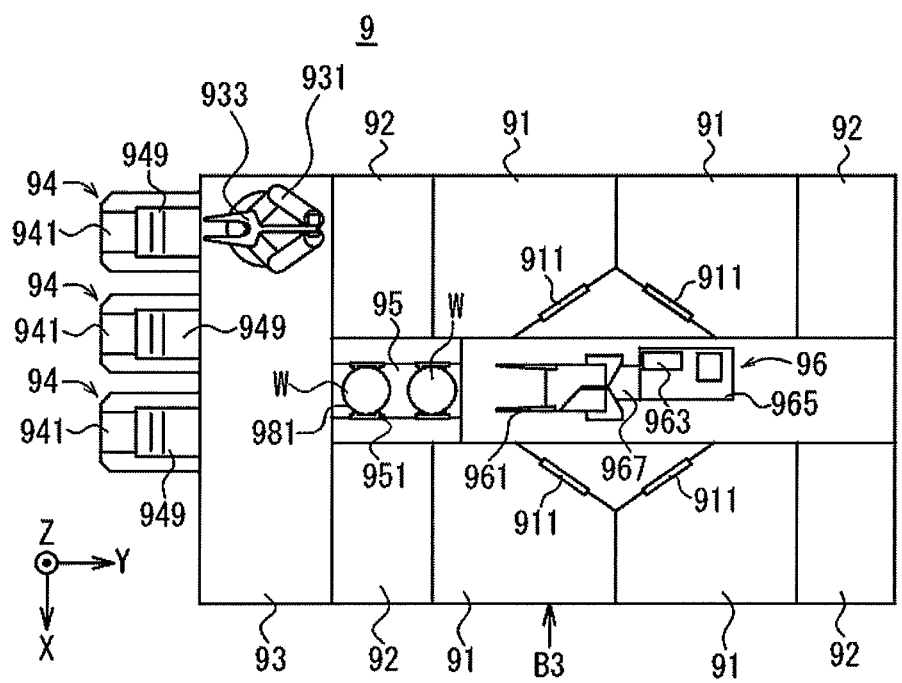

F I G. 1 1
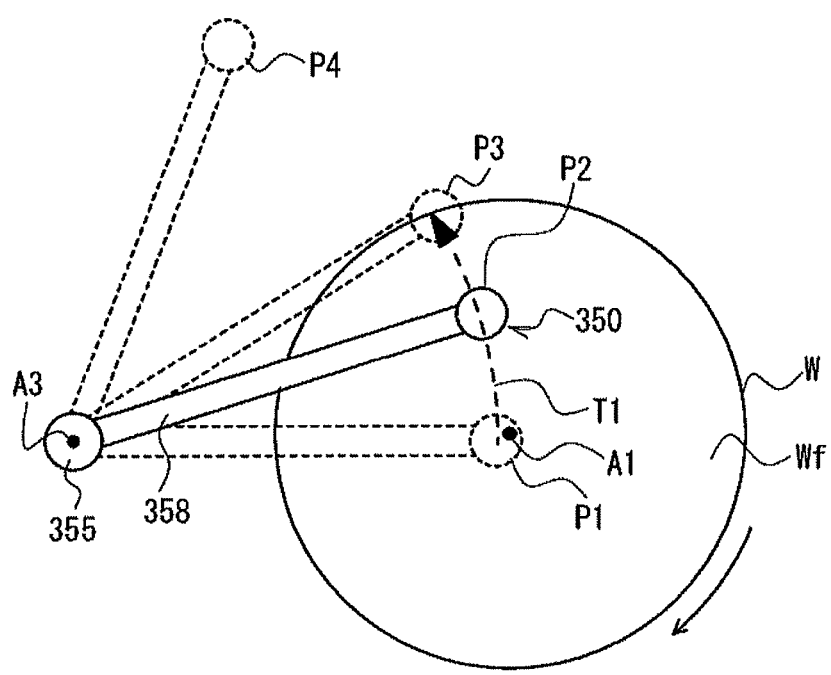

F I G. 1 2
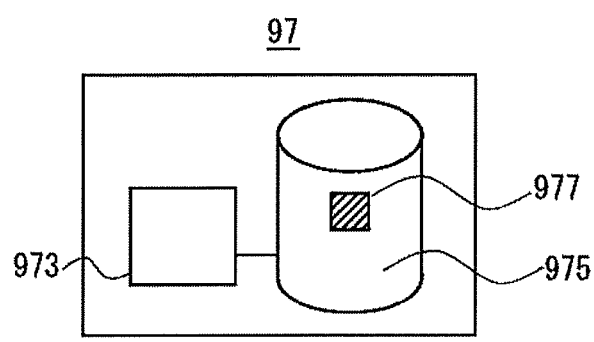

F I G. 1 4
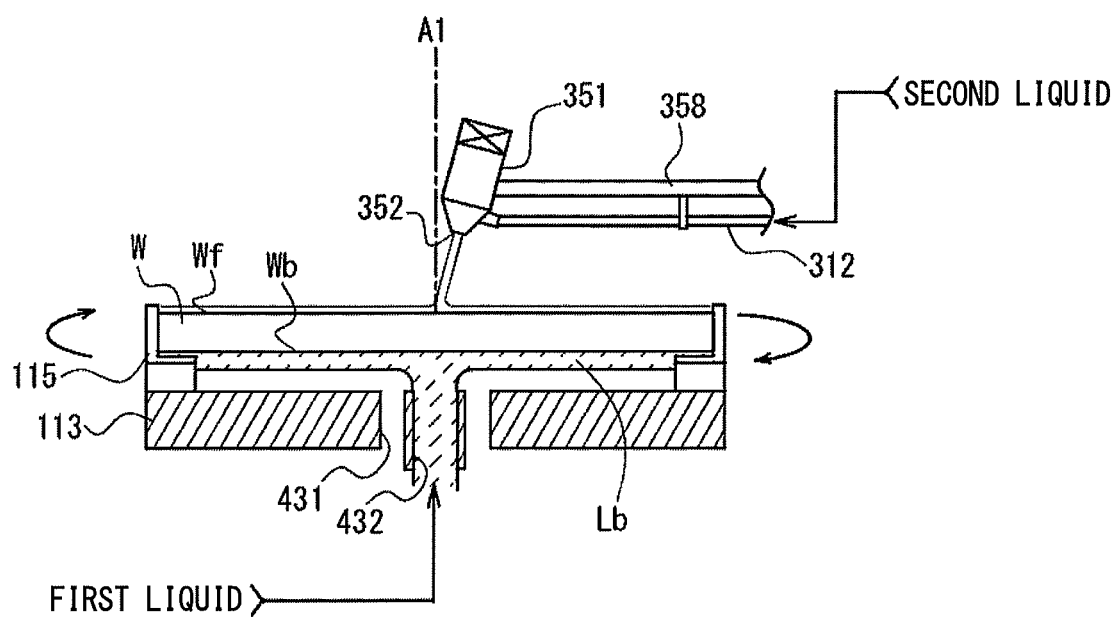

F I G. 1 7
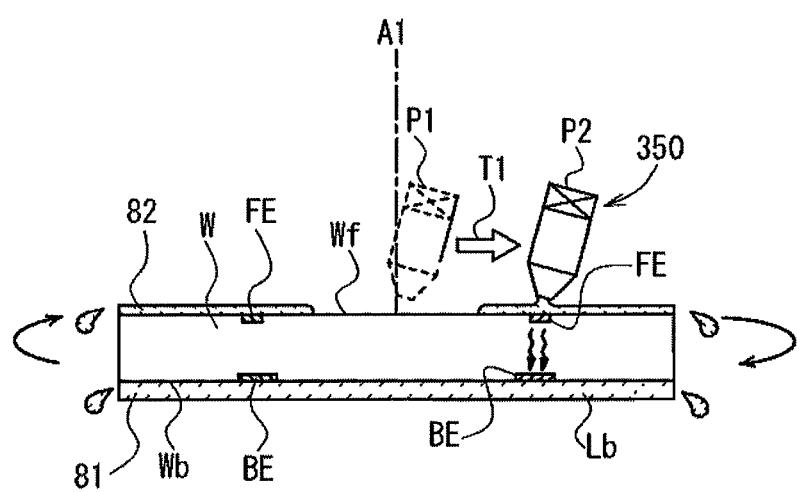

F I G. 1 8
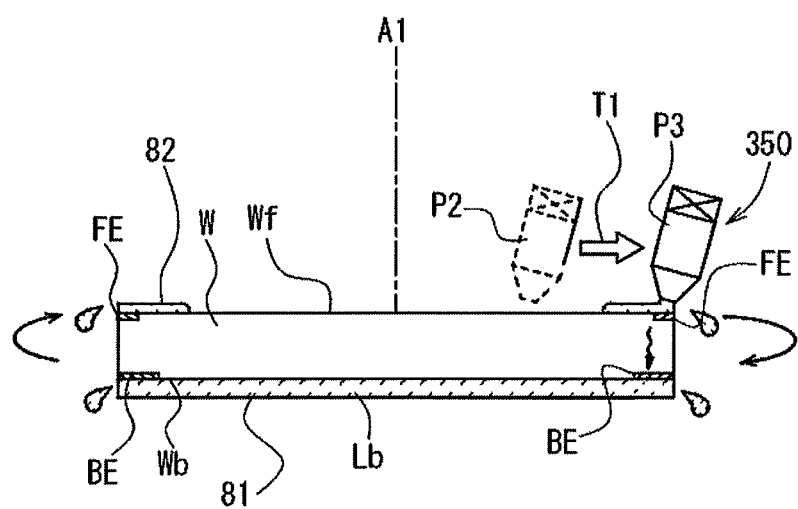

F I G. 2 0
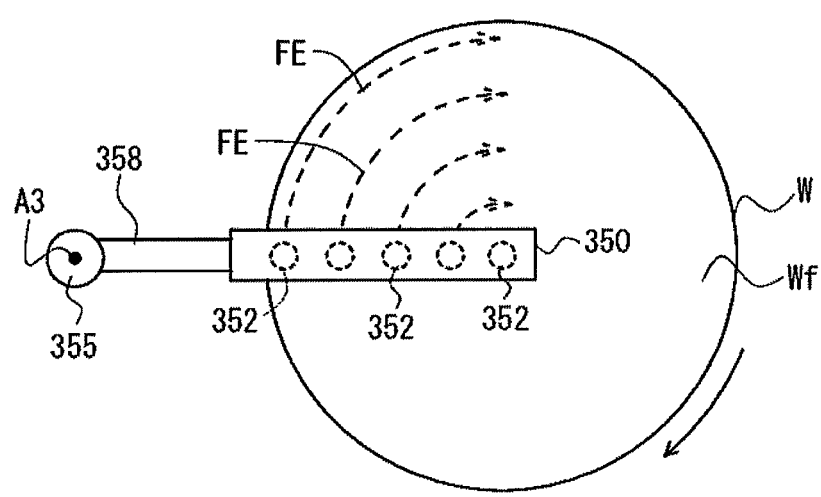

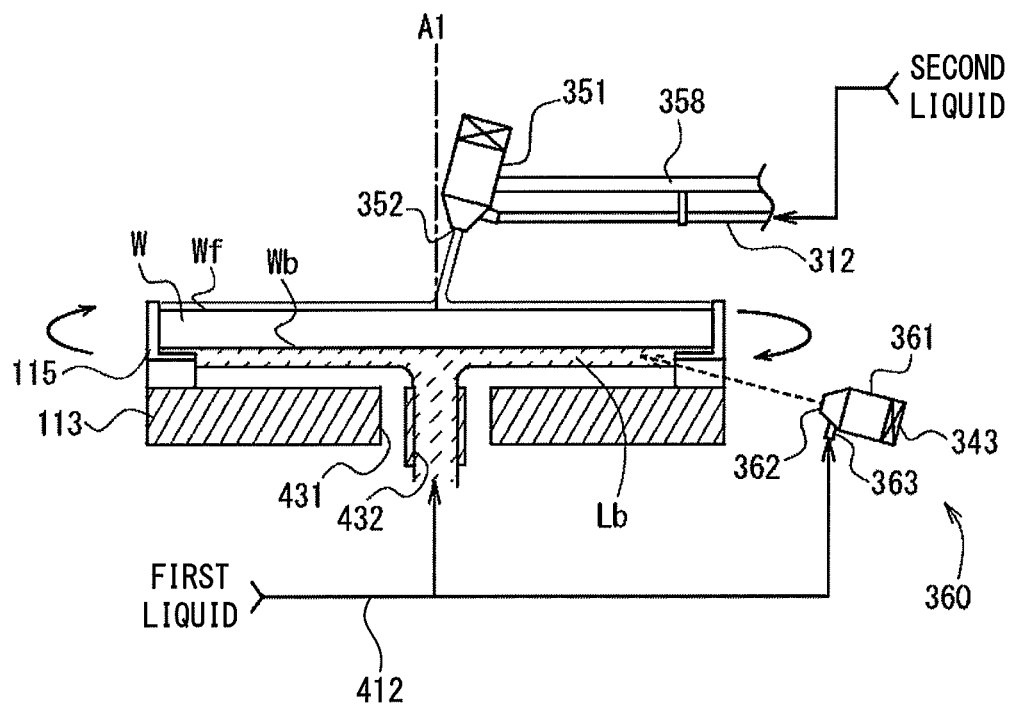
F I G. 2 2

SUBSTRATE CLEANING METHOD AND SUBSTRATE CLEANING APPARATUS

CROSS REFERENCE TO RELATED APPLICATION

The disclosure of Japanese Patent Application enumerated below including specification, drawings and claims is incorporated herein by reference in its entirety: No. 2014-185758 filed on Sep. 12, 2014.

BACKGROUND OF THE INVENTION

1. Field of the Invention

The invention relates to a substrate cleaning apparatus and a substrate cleaning method of cleaning a substrate that has one principal surface on which pattern elements are formed and another principal surface to be cleaned. Note that substrates to be cleaned include semiconductor wafers, glass substrates for photo mask, glass substrates for liquid crystal display, glass substrates for plasma display, substrates for FED (Field Emission Display), substrates for optical disc, substrates for magnetic disc, substrates for opto-magnetic disc and various other substrates.

2. Description of the Related Art

A process of manufacturing an electronic component such as a semiconductor device or a liquid crystal display device includes a process of forming fine pattern elements by repeatedly applying processings such as film formation and etching to a top surface of a substrate. Here, if particles are adhering to an under surface of this substrate, they cause defocusing in a photolithography process and it becomes difficult to form desired fine pattern elements. Further, cross-contamination may occur due to a substrate having particles adhering to the under surface.

Further, an under surface of a substrate is often vacuum-sucked during substrate conveyance and particles may adhere to the under surface of the substrate in that process. Thus, numeral technologies for cleaning an under surface of a substrate have been proposed. For example, an apparatus described in JP2010-27816A performs ultrasonic cleaning by supplying an ultrasonic treatment liquid obtained by applying ultrasonic waves to a treatment liquid to an under surface of a substrate. Further, in this apparatus, pattern elements are reinforced by freezing a liquid film formed on a top surface of the substrate in order to prevent the pattern elements formed on the top surface of the substrate from being damaged by ultrasonic waves transmitted to the top surface side of the substrate during ultrasonic cleaning.

The apparatus described in JP2010-27816A is a cleaning apparatus making use of the principle of generating air bubbles (cavitation bubbles) of a micron size in a cleaning liquid by transmitting ultrasonic vibration to the cleaning liquid. A strong liquid flow is generated in the cleaning liquid in conjunction with motions of the cavitation bubbles such as expansion and collapse, whereby particles adhering to a top surface of a substrate are separated from the substrate top surface and washed away together with the cleaning liquid to clean the substrate top surface.

JP2013-84667A discloses a technology for cleaning the entire top surface and under surface of a substrate by accommodating the substrate in an accommodation section and supplying a degassed treatment liquid into the accommodation section to apply ultrasonic vibration to the treatment liquid for the purpose of suppressing the damage of pattern elements formed on the top surface of the substrate similarly to JP2010-27816A. The amount of generated cavitation bubbles is reduced due to a reduction in dissolved gas concentration in the treatment liquid, thereby suppressing damage on the pattern elements of the substrate.

Further, as another substrate cleaning technology using an ultrasonic treatment liquid, JP2004-363453A discloses an apparatus for cleaning a substrate by supplying an ultrasonic treatment liquid applied with ultrasonic waves to a top surface of the substrate from a nozzle while rotating the substrate. This apparatus moves the nozzle in a predetermined direction while maintaining inclination angles, which a top surface of the substrate and a peripheral edge area of the substrate form an axis of the nozzle, constant. This causes ultrasonic cleaning to be performed while the ultrasonic treatment liquid is sprayed not only to the substrate top surface, but also to the substrate peripheral edge area.

SUMMARY OF THE INVENTION

In cleaning a substrate that has one principal surface (top surface) on which pattern elements and another principal surface (under surface) to be cleaned, it is necessary to suppress damage such as the collapse of these pattern elements and satisfactorily clean the other principal surface. In recent years in which pattern elements are made finer, the size of particles needed to be removed from substrates has also become smaller and, associated with this, fine particles need to be removed also for the other principal surface. Further, an adhesion force to the substrate tends to be stronger as the size of particles becomes smaller. Thus, in order to reliably remove fine particles, a cleaning force to remove the particles (i.e. intensity of a physical force applied to particles to separate the particles from the principal surface of the substrate) needs to be increased.

In the apparatus described in JP2013-84667A, the entire top surface and under surface of the substrate are cleaned by supplying the degassed treatment liquid and applying ultrasonic vibration to this treatment liquid. In this way, damage on the pattern elements of the substrate is suppressed. However, since the under surface is cleaned by the degassed treatment liquid as the top surface is, a cleaning force for the under surface is reduced and fine particles cannot be removed on the under surface as compared with the case where the treatment liquid is not degassed, with the result that it may not be possible to achieve a desired particle removal rate.

On this point, the liquid applied with ultrasonic vibration is directly supplied to the under surface of the substrate from the ultrasonic cleaning nozzle in the apparatus of JP2010-27816A. Thus, particles can be sufficiently removed for a part of the under surface of the substrate where the supply of the liquid from the ultrasonic cleaning nozzle is directly received. However, in the method of JP2010-27816A, the liquid applied with ultrasonic vibration can be supplied to the under surface of the substrate only from the limited position such as the nozzle obliquely below the substrate or on the under surface side. Thus, the part where the supply of the liquid from the ultrasonic cleaning nozzle is directly received is also limited to a specific position on the under surface of the substrate. Since ultrasonic vibration transmitted to the substrate is more attenuated with distance from the part where the supply of this liquid is directly received, the cleaning force is also reduced. Therefore, in the method of JP2010-27816A, it may not be possible to sufficiently remove particles on the entire under surface of the substrate.

Further, in the apparatus described in JP2010-27816A, it is necessary to freeze the liquid film and clean the under surface of the substrate after the freezing is completed in order to prevent the damage of the pattern elements. Thus, a total time required to clean the under surface of the substrate, i.e. a tact time becomes longer. Further, cooling gas needs to be supplied to the liquid film to perform the freezing and an increase of running cost is unavoidable.

The invention was developed in view of the above problems and aims to provide a substrate cleaning method and a substrate cleaning apparatus capable of preventing the collapse of pattern elements on one principal surface by cavitation and satisfactorily cleaning another surface of the substrate in an ultrasonic cleaning treatment for cleaning the substrate by removing contaminants adhering to the substrate under surface by ultrasonic waves.

According to a first aspect of the disclosure, there is provided a substrate cleaning method of cleaning a substrate that has one principal surface on which pattern elements are formed and another principal surface to be cleaned. The method comprises: a substrate holding process of holding the substrate horizontally with the other principal surface faced vertically downward; a liquid film forming process of forming a liquid film by supplying a first liquid to the other principal surface; and an ultrasonic wave cleaning process of ultrasonically cleaning the other principal surface by supplying an ultrasonic wave applying liquid to the one principal surface while the liquid film being formed on the other principal surface and transmitting ultrasonic vibration from the one principal surface side to the other principal surface and the liquid film of the first liquid formed on the other principal surface via the substrate, the ultrasonic wave applying liquid being obtained by applying ultrasonic waves to a second liquid; wherein the first liquid has a higher cavitation intensity, which is a stress per unit area acting on the substrate by cavitation caused in the liquid when ultrasonic waves are transmitted to the liquid present on the principal surface of the substrate, than the second liquid.

According to a first aspect of the disclosure, there is provided a substrate cleaning apparatus for cleaning another principal surface of a substrate having pattern elements formed on one principal surface. The apparatus comprises: a substrate holder for holding the substrate horizontally with the other principal surface faced vertically downward; a first liquid discharger for discharging a first liquid to the other principal surface; a liquid film former for forming a liquid film of the first liquid on the other principal surface; and a second liquid discharger for ultrasonically cleaning the other principal surface by discharging an ultrasonic wave applying liquid to the one principal surface while the liquid film of the first liquid being formed on the other principal surface and transmitting ultrasonic vibration from the one principal surface side to the other principal surface and the liquid film of the first liquid formed on the other principal surface via the substrate, the ultrasonic wave applying liquid being obtained by applying ultrasonic waves to a second liquid; wherein the first liquid has a higher cavitation intensity, which is a stress per unit area acting on the substrate by cavitation caused in the liquid when ultrasonic waves are transmitted to the liquid present on the principal surface of the substrate, than the second liquid discharged to the one principal surface.

According to the invention, it is possible to prevent the collapse of pattern elements on one principal surface of a substrate by cavitation and satisfactorily clean another principal surface of the substrate in the ultrasonic cleaning treatment for cleaning the substrate by removing contaminants adhering to the substrate under surface (other principal surface) by ultrasonic waves.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

BRIEF DESCRIPTION OF THE DRAWINGS

FIG. 2 is a sectional view taken along a line B1-B1 indicted by arrows in FIG. 1.

FIG. 11 is a diagram schematically showing the movement of a substrate and the nozzle of the second liquid discharger in FIG. 9.

FIG. 12 is a diagram showing the configuration of a control unit in the processing unit of FIG. 4.

FIGS. 14, 16, 17 and 18 are diagrams showing a state of a substrate top surface in the first embodiment.

FIG. 20 is a schematic diagram of the nozzle and the substrate in an ultrasonic cleaning process of the second embodiment when viewed from above.

FIG. 22 is a diagram schematically showing a peripheral configuration of a substrate according to a fourth embodiment.

DETAILED DESCRIPTION OF THE PREFERRED EMBODIMENTS

In the following description, substrates mean various substrates such as semiconductor wafers, glass substrates for photomasks, glass substrates for liquid crystal displays, glass substrates for plasma displays, substrates for FEDs (Field Emission Displays), substrates for optical discs, substrates for magnetic discs and substrates for magneto-optical discs.

In the following description, a substrate having a circuit pattern and the like formed only on one principle surface is used as an example. Here, a principle surface where the circuit pattern and the like are formed is called a "top surface" and another principle surface where the circuit pattern and the like are not formed is called an "under surface". Further, a surface of the substrate facing downward is called a "lower surface" and a surface thereof facing upward is called an "upper surface". Note that it is assumed the upper surface is the top surface in the following description.

Hereinafter, embodiments of the invention are described with reference to the drawings, taking a substrate processing apparatus used to process semiconductor substrates as an example. Note that the invention can be also applied to processes for various substrates such as glass substrates for liquid crystal displays without being limited to processes for semiconductor substrates.

First Embodiment

Figure 1:
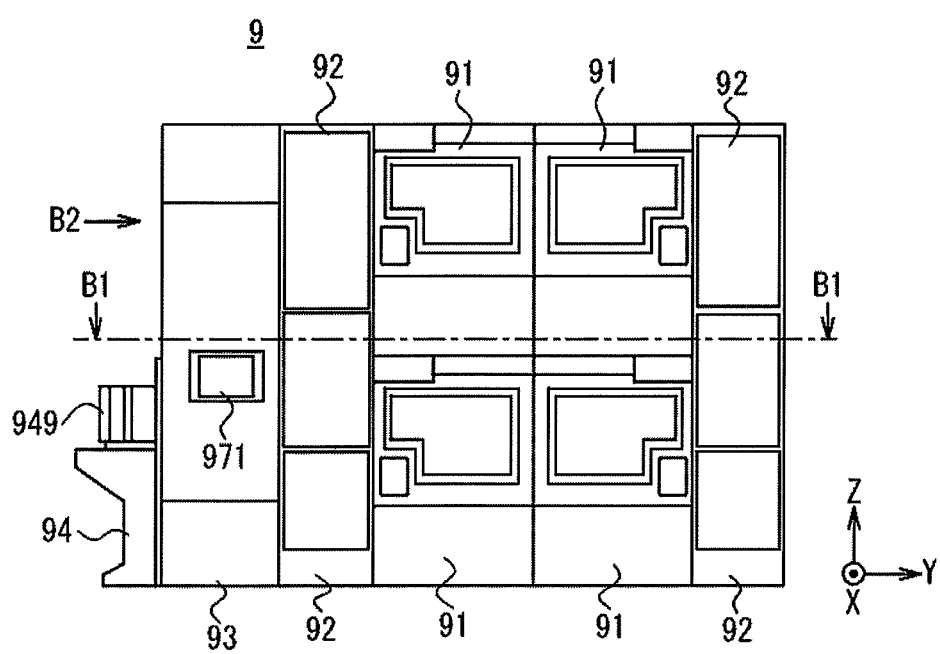
FIG. 1 is a front view showing a schematic construction of a substrate processing apparatus according to the invention.
Figure 3:
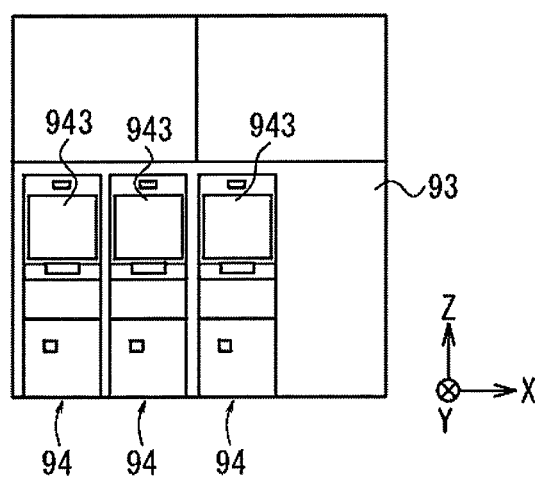
FIG. 3 is a side view of the substrate processing apparatus in FIG. 1 when viewed in a direction of an arrow B2.

FIGS. 1, 2 and 3 are diagrams showing a schematic construction of a substrate processing apparatus 9 according to this invention. FIG. 1 is a front view of the substrate processing apparatus 9, FIG. 2 is a sectional view taken along a line B1-B1 indicted by arrows of the substrate processing apparatus 9 in FIG. 1. FIG. 3 is a side view of the substrate processing apparatus 9 in FIG. 1 when viewed in a direction of an arrow B2. This apparatus is a single-substrate processing apparatus used in a cleaning process for removing contaminants such as particles (hereinafter, referred to as "particles and the like") adhering to a substrate W such as a semiconductor substrate (hereinafter, merely referred to as a "substrate W").

Note that a coordinate system with a Z axis extending in a vertical direction and an XY plane as a horizontal plane is appropriately attached to the respective drawings to make a directional relationship clear. Further, in each coordinate system, a pointing direction of an arrow is a + (plus) direction and an opposite direction is a − (minus) direction. In the respective drawings and the description below, the top surface of the substrate is referred to as a "substrate top surface Wf" and the under surface of the substrate is referred to as a "substrate under surface Wb".

<1-1. Overall Construction of Substrate Processing Apparatus>

With reference to FIGS. 1, 2 and 3, overall construction of the substrate processing apparatus according to a first embodiment is described. The substrate processing apparatus 9 includes openers 94 each carrying a FOUP (Front Open Unified Pod) 949 housing, for example, 25 substrates W, an indexer unit 93 for taking out an unprocessed substrate W from the FOUP 949 on the opener 94 and storing the substrate W after the completion of the process into the FOUP 949, a shuttle 95 for transferring the substrate W between the indexer unit 93 and a center robot 96, processing units 91 for cleaning the substrate W loaded thereinto by the center robot 96 and fluid boxes 92 housing pipes, on-off valves and the like for liquids and gases to be supplied to the processing units 91.

First, a planar arrangement of these is described using FIG. 2. At one end (left end in FIG. 2) of the substrate processing apparatus 9, a plurality of (three in this embodiment) openers 94 are arranged. The indexer unit 93 is arranged to the right of (+Y side) and adjacent to the openers 94 in FIG. 2. The shuttle 95 is arranged near a center of the indexer unit 93 in an X direction and to the right of (+Y side) and adjacent to the indexer unit 93 in FIG. 2. The center robot 96 is so arranged to the right of (+Y side) and adjacent to the shuttle 95 in FIG. 2 as to be juxtaposed with the shuttle 95 in a +Y direction. In this way, the indexer unit 93, the shuttle 95 and the center robot 96 are arranged on two orthogonal lines.

At an upper side (−X side) and a lower side (+X side) of the shuttle 95 and the center robot 96 juxtaposed in the +Y direction in FIG. 2, the processing units 91 and the fluid boxes 92 are arranged. That is, the fluid box 92, the processing unit 91, the processing unit 91 and the fluid box 92 are arranged in this order at the upper side (−X side) or the lower side (+X side) of the shuttle 95 and the center robot 96 in FIG. 2 and to the right of (+Y side) and adjacent to the indexer unit 93 in FIG. 2.

Note that an operation unit 971 of a control unit 97 to be described later is disposed on a side surface of the indexer unit 93 at the +X side (lower side in FIG. 2) (see FIG. 1).

Next, the opener 94 is described. The opener 94 includes a placing surface 941 which is located on the top of the opener 94 and on which the FOUP 949 is placed, and an opening/closing mechanism 943 (see FIG. 3) arranged to face the front surface of the FOUP 949 (surface of the FOUP 949 on the right side (+Y side) in FIGS. 3 and 4) and adapted to open and close a lid (not shown) on the front surface of the FOUP 949.

The FOUP 949 loaded by an automatic transport vehicle or the like from the outside of the substrate processing apparatus 9 is placed on the placing surface 941 of the opener 94 and the lid is opened by the opening/closing mechanism 943. This enables an indexer robot 931 of the indexer unit 93 to be described later to unload the substrate W from the FOUP 949 or conversely to load the substrate W into the FOUP 949.

Next, the indexer unit 93 is described. The indexer unit 93 includes the indexer robot 931 which takes out unprocessed substrates W before the process one by one from the FOUP 949, stores the substrates W after the process one by one into the FOUP 949 and further transfers the substrates W to and from the shuttle 95. This indexer robot 931 includes two upper and lower hands 933 spaced apart in a Z-axis direction. The indexer robot 931 is constructed to be horizontally movable in an X-axis direction, vertically movable in the Z-axis direction and rotatable about the Z axis.

Next, the shuttle 95 is described. The shuttle 95 includes two upper and lower hands 951 spaced apart in the Z-axis direction and adapted to hold the substrate W at positions which are near upper (−X side) and lower (+X side) peripheral parts in FIG. 2 and do not interfere with the hands 933 of the indexer robot 931 and hands 961 of the center robot 96 to be described later. Further, the shuttle 95 includes a horizontal moving mechanism (not shown) for independently horizontally moving the two hands 951 in a Y-axis direction.

The shuttle 95 is constructed to be able to transfer the substrate W to and from both the indexer robot 931 and the center robot 96. That is, when the hands 951 are moved to the left side (−Y side) in FIG. 2 by the unillustrated horizontal moving mechanism, the transfer of the substrate W to and from the hands 933 of the indexer robot 931 is possible. Further, when the hands 951 are moved to the right side (+Y side) in FIG. 2 by the unillustrated horizontal moving mechanism, the transfer of the substrate W to and from the hands 961 of the center robot 96 is possible.

Next, the center robot 96 is described. The center robot 96 include two upper and lower hands 961 spaced apart in the Z-axis direction and adapted to hold one substrate W and transfer it between the shuttle 95 or the processing unit 91. Further, the center robot 96 includes an elevating shaft 963 which extends in the vertical direction (Z-axis direction) and along which the hands 961 are moved in the vertical direction, an elevating mechanism 965 for moving the hands 961 upward and downward and a rotating mechanism 967 for rotating the hands 961 about the Z axis. The center robot 96 is so constructed that the hands are vertically movable along the elevating shaft 963 in the Z-axis direction and rotatable about the Z axis by the rotating mechanism 967.

Note that an opening used to load or unload the substrate W into or from the processing unit 91 by extending the hands 961 of the center robot 96 is provided at a side wall of each processing unit 91 to be described later and in a surface facing the center robot 96. Further, a shutter 911 is provided to close the above opening and keep an atmosphere in the processing unit 91 clean while the center robot 96 does not transfer the substrate W to and from the processing unit 91.

Note that the processing units 91 and the fluid boxes 92 are stacked up in two upper and lower levels as shown in FIG. 1. Accordingly, the substrate processing apparatus 9 in this embodiment includes eight processing units 91 and eight fluid boxes 92.

Next, a procedure of conveying the substrate W by the indexer robot 931, the shuttle 95 and the center robot 96 is described. The FOUP 949 loaded by the automatic transport vehicle or the like from the outside of the substrate processing apparatus 9 is placed on the placing surface 941 of the opener 94 and the lid thereof is opened by the opening/closing mechanism 943. The indexer robot 931 takes out one substrate W at a predetermined position of the FOUP 949 by the lower hand 933. Thereafter, the indexer robot 931 moves to a position before the shuttle 95 (near the center of the indexer unit 93 in the X-axis direction in FIG. 2). Simultaneously, the shuttle 95 moves the lower hand 951 to a side of the indexer unit 93 (left side (−Y side) in FIG. 2).

The indexer robot 931 having moved to the position before the shuttle 95 transfers the substrate W held on the lower hand 933 to the lower hand 951 of the shuttle 95. Thereafter, the shuttle 95 moves the lower hand 951 to a side of the center robot 96 (right side (+Y side) in FIG. 2). Further, the center robot 96 moves to a position where the hand 961 is facing the shuttle 95.

Thereafter, the center robot 96 takes out the substrate W held on the lower hand 951 of the shuttle 95 by the lower hand 961 and moves such that the hand 961 faces a shutter of any one of the eight processing units 91. Thereafter, the shutter 911 is opened, the center robot 96 extends the lower hand 961 to load the substrate W into the processing unit 91, and the cleaning process for the substrate W is started in the processing unit 91.

The substrate W completed with the processing in the processing unit 91 is carried out by the upper hand 961 of the center robot 96 and, thereafter, successively transferred to the upper hand 961 of the center robot 96, the upper hand 951 of the shuttle 95 and the upper hand 933 of the indexer robot 93 in an order opposite to the one in the case of conveying the unprocessed substrate W and finally accommodated at a predetermined position of FOUP 949.

<1-2. Processing Unit>

Figure 4:
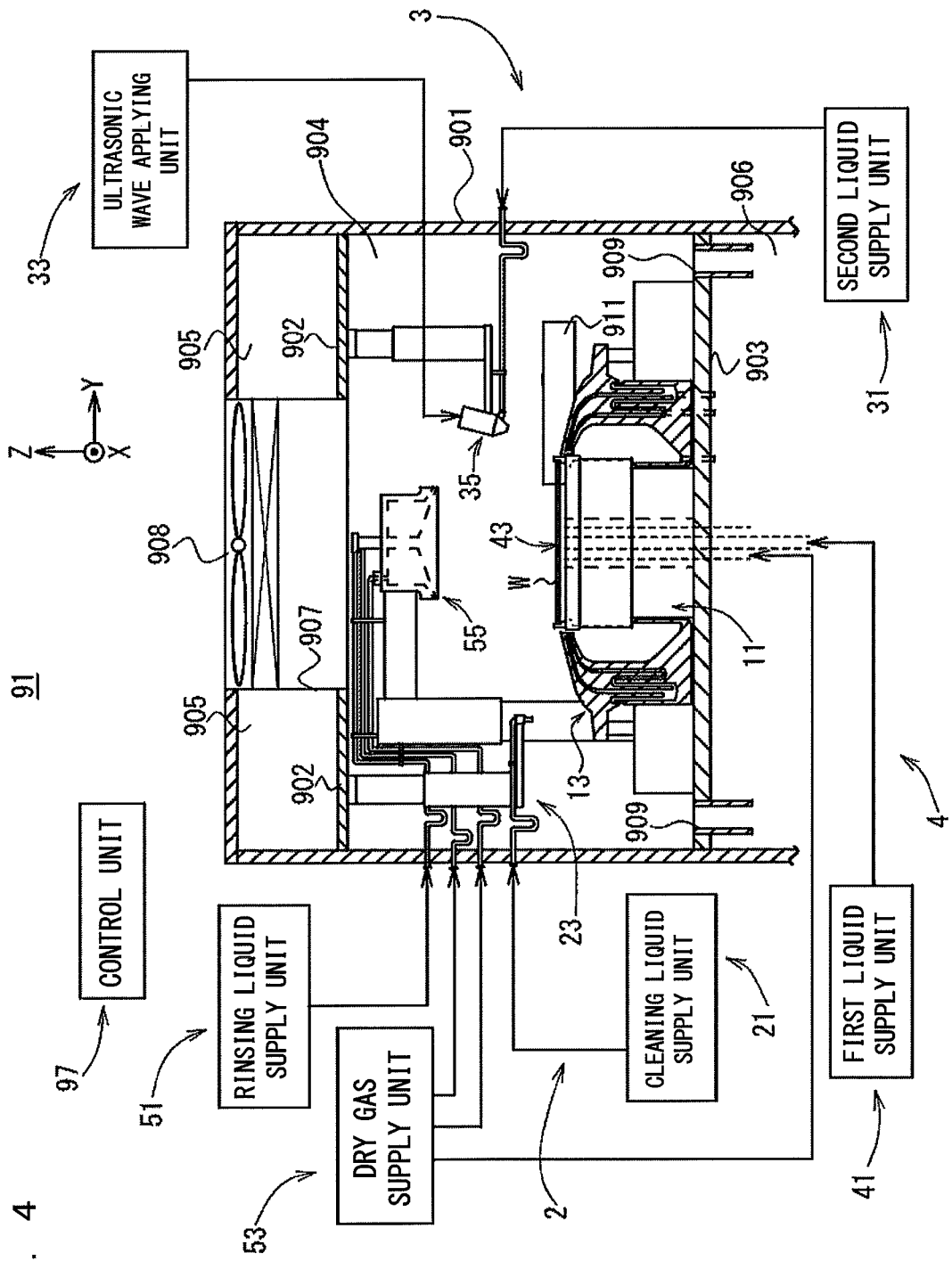
FIG. 4 is a diagram showing the overall configuration of a processing unit according to the invention.

Next, the overall configuration of the processing unit 91 is described using FIG. 4. FIG. 4 is a diagram showing the overall configuration of the processing unit 91. Here, since each of eight processing units 91 in this embodiment is identically configured, the process unit 91 indicated by an arrow B3 in FIG. 2 (processing unit 91 on a left lower side in FIG. 1) is described as a representative below.

The processing unit 91 includes a rotary substrate holder 11 for holding the substrate W having the pattern elements formed on the top surface substantially horizontally and a waste liquid collector 13 for receiving and discharging/draining scattered substances from the substrate holder 11 and the substrate W.

Further, the processing unit 91 includes a cleaning liquid discharger 2 for discharging a cleaning liquid to the substrate top surface Wf, a first liquid discharger 4 for discharging a first liquid to be described later to the substrate under surface Wb, a second liquid discharger 3 for discharging a second liquid to be described later to the substrate top surface Wf, a fluid injection unit 55 for injecting a rinsing liquid and dry gas to the substrate top surface Wf and a control unit 97 for controlling the operation of each component of the substrate processing apparatus 9 based on a substrate processing program to be described later.

The cleaning liquid discharger 2 includes a cleaning liquid discharge unit 21 for discharging the cleaning liquid to the substrate top surface Wf and a cleaning liquid supply unit 23 for supplying the cleaning liquid to the cleaning liquid discharge unit 21.

The first liquid discharger 4 includes an under surface discharger 43 for discharging a liquid such as the first liquid and dry gas to the substrate under surface Wb and a first liquid supply unit 41 for supplying the first liquid to the under surface discharger 43.

The second liquid discharger 3 includes a second liquid discharge unit 35 for discharging the second liquid to the substrate top surface Wf, an ultrasonic wave applying unit 33 for applying ultrasonic waves to the second liquid and a second liquid supply unit 31 for supplying the second liquid to the second liquid discharge unit 35.

The detailed configurations of the cleaning liquid discharger 2, the first liquid discharger 4, the second liquid discharger 3 and the fluid injection unit 55 are described later.

Next, the processing unit 91 is described. The processing unit 91 includes a side wall 901 having a hollow and substantially rectangular column shape, an upper base member 902 and a lower base member 903 substantially horizontally fixed to the side wall 901 and partitioning a space in the processing unit 91, an upper space 905 above the upper base member 902 in the processing unit 91, a processing space 904 inwardly of the side wall 901, below the upper base member 902 and above the lower base member 903, and a lower space 906 inwardly of the side wall 901 and below the lower base member 903. Note that although the side wall 901 has a substantially rectangular column shape in this embodiment, the shape of the side wall 901 is not limited to that and may be a substantially cylindrical shape or another shape.

Note that the opening through which the center robot can carry the substrate W into and out of the processing unit 91 and a shutter 911 for keeping the cleanliness of atmosphere in the processing unit 91 by closing the opening are provided on a side of the side wall 901 facing the center robot 96 as described above.

The upper base member 902 is substantially horizontally fixed to an upper part (upper side in FIG. 4) of the side wall 901 and partitions between the upper space 905 and the processing space 904 which are inner spaces of the processing unit 91. An atmosphere introducing passage 907 communicating with the upper end of the processing unit 91 from the lower surface of the upper base member 902 is provided near a center of the upper base member 902. Further, a fan filter unit 908 for supplying clean atmosphere into the processing space 904 is provided near the upper end of the atmosphere introducing passage 907. The fan filter unit 908 disposed in the atmosphere introducing passage 907 in the upper space 905 takes in the atmosphere from above the processing unit 91 and supplies the cleaned atmosphere into the processing space 904 located below after collecting fine particles in the atmosphere by a built-in HEPA filter or the like.

The lower base member 903 is substantially fixed to a middle part ((−Z) side in FIG. 4) of the side wall 901 and partitions between the processing space 904 and the lower space 906 which are inner spaces of the processing unit 91. The lower base member 903 is provided with a plurality of exhaust ports 909, which are connected to an unillustrated exhaust system and discharge the atmosphere in the processing space 904 to outside.

Here, the interior of the processing space 904 is a space where clean atmosphere is kept and the cleaning and the like of the substrate W are performed. Further, the upper and lower spaces 905, 906 are spaces in which drive sources and the like for driving each member disposed in the processing space 904 are arranged.

The atmosphere supplied into the processing space 904 through the fan filter unit 908 flows downward from an upper part of the processing space 904 and is finally discharged to the outside of the processing space 904 through the exhaust ports 909. In this way, fine particles of the liquid and the like produced in each process of processing the substrate W to be described later are discharged from the exhaust ports 909 by being moved downward by an air flow flowing downward from above in the processing space 904. Thus, the adhesion of these fine particles to the substrate W and each member in the processing space 904 can be prevented.

Figure 5:
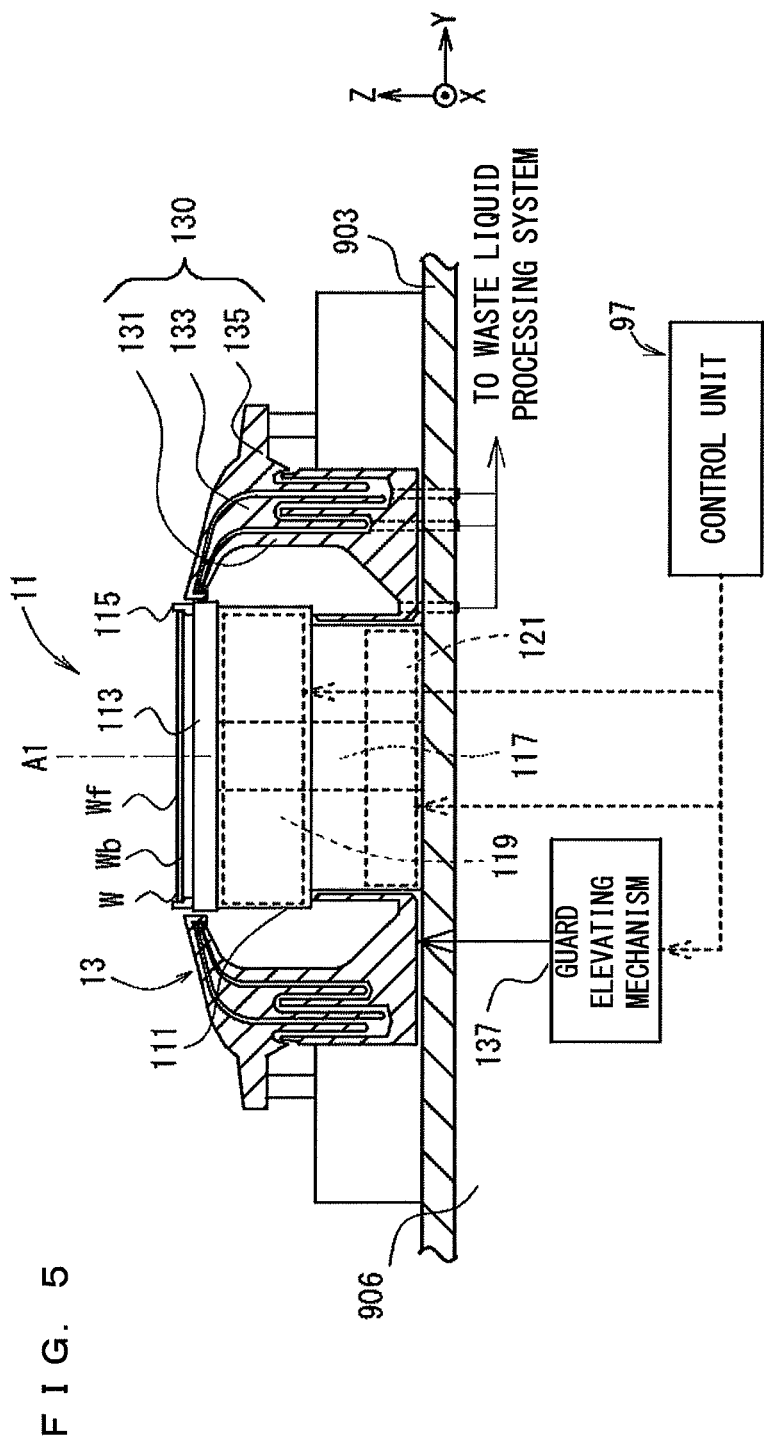
FIG. 5 is a diagram showing the configurations of a substrate holder and a waste liquid collector in the processing unit of FIG. 4.

Next, the configurations of the substrate holder 11 and the waste liquid collector 13 are described using FIG. 5. FIG. 5 is a diagram showing the configurations of the substrate holder 11 and the waste liquid collector 13.

First, the substrate holder 11 is described. A base unit 111 of the substrate holder 11 is fixed onto the lower base member 903 and a disc-like spin base 113 having an opening in a central part is rotatably and substantially horizontally held on the base unit 111. The upper end of a central shaft 117 is fixed to a center of the lower surface of the spin base 113 by a fastening part such as a screw. Further, a plurality of substrate holding members 115 for gripping a peripheral edge part of the substrate W stand near the peripheral edge of the spin base 113. It is sufficient to provide three or more substrate holding members 115 to reliably hold the circular substrate W and the substrate holding members 115 are arranged at an equal angular interval along the peripheral edge of the spin base 113. Each substrate holding member 115 includes a supporting pin for supporting the peripheral edge part of the substrate W and a holding pin for holding the substrate W by pressing an outer peripheral end surface of the substrate W supported by a substrate supporting portion.

Each substrate holding member 115 is coupled to an air cylinder in a substrate holding member driving mechanism 119 via a known link mechanism, a sliding member or the like. Note that the substrate holding member driving mechanism 119 is disposed below the spin base 113 in the base unit 111. Further, the substrate holding member driving mechanism 119 is electrically connected to the control unit 97. The control unit 97 issues an operation command to the substrate holder 11 to extend or contract the air cylinder of the substrate holding member driving mechanism 119. In this way, each substrate holding member 115 can be switched between a "closed state" where the holding pin thereof presses the outer peripheral end surface of the substrate W and an "open state" where the holding pin thereof is separated from the outer peripheral end surface of the substrate W. Note that it is also possible to use a known drive source such as a motor or a solenoid besides the air cylinder as the drive source for the substrate holding members 115.

Each substrate holding member 115 is set to the open state when the substrate W is transferred to the spin base 113 while being set to the closed state when the cleaning or the like is applied to the substrate W. When each substrate holding member 115 is set to the closed state, it grips the peripheral edge part of the substrate W including the outer peripheral end surface and holds the substrate W in a horizontal posture at a predetermined distance from the spin base 113. In this way, the substrate W is held in a state where the substrate top surface Wf is facing upward and the substrate under surface Wb is facing downward.

Further, a rotary shaft of a substrate rotating mechanism 121 including a motor is coupled to the central shaft 117 of the substrate holder 11. Note that the substrate rotating mechanism 121 is disposed on the lower base member 903 in the base unit 111. Further, the substrate rotating mechanism 121 is electrically connected to the control unit 97. The control unit 97 issues an operation command to the substrate holder 11 to drive the substrate rotating mechanism 121. In this way, the spin base 113 fixed to the central shaft 117 rotates about a rotation center axis A1.

In the above description, the substrate holder 11 corresponds to a "substrate holder" in the invention. Further, the spin base 113, the substrate holding members 115, the central shaft 117 and the substrate rotating mechanism 121 correspond to a "substrate rotator" in the invention.

Next, the waste liquid collector 13 is described. A substantially circular ring-shaped cup 130 is provided around the substrate holder 11 and on the lower base member 903 to surround the substrate W held by the substrate holder 11. The cup 130 is substantially rotationally symmetrically shaped with respect to the rotation center axis A1 so as to be able to collect liquid and the like scattered from the substrate holder 11 and the substrate W. Note that the cup 130 is shown in cross-section for description in each figure.

The cup 130 is composed of an inner constituent member 131, a middle constituent member 133 and an outer constituent member 135 which can be elevated and lowered independently of each other. As shown in FIG. 5, the cup 130 is structured such that the middle and outer constituent members 133, 135 are placed on the inner constituent member 131. The inner, middle and outer constituent members 131, 133 and 135 are respectively connected to a guard elevating mechanism 137 provided in the lower space 906 and configured by a known driving mechanism such as a motor and a ball screw. Further, the guard elevating mechanism 137 is electrically connected to the control unit 97. The control unit 97 issues an operation command to the waste liquid collector 13 to drive the guard elevating mechanism 137. In this way, the inner, middle and outer constituent members 131, 133 and 135 vertically move along the rotation center axis A1 independently or with a plurality of members synchronized.

The waste liquid collector 13 includes three collection grooves for introducing the liquid collected by the inner, middle and outer constituent members 131, 133 and 135 to waste liquid processing systems on different routes. The collection grooves are respectively provided substantially along concentric circles centered on the rotation center axis A1. Pipes connected to the unillustrated waste liquid processing systems are respectively connected to the collection grooves.

The cup 130 is used by combining vertical positions of the respective inner, middle and outer constituent members 131, 133 and 135. Specifically, available positions include a home position where all of the inner, middle and outer constituent members 131, 133 and 135 are at a lower position, an outer collection position where the inner and middle constituent members 131, 133 are at the lower position and only the outer constituent member 135 is at an upper position, a middle collection position where the inner constituent member 131 is at the lower position and the middle and outer constituent members 133, 135 are at the upper position and an inner collection position where all of the inner, middle and outer constituent members 131, 133 and 135 are at the upper position.

The home position is a position assumed such as when the center robot 96 carries the substrate W into and out of the processing unit 91. The outer collection position is a position where the liquid received by the outer constituent member 135 is collected and introduced to the outer collection groove, the middle collection position is a position where the liquid received by the middle constituent member 133 is introduced to the middle collection groove and the inner collection position is a position where the liquid received by the inner constituent member 131 is introduced to the inner collection groove.

By using the thus configured waste liquid collector 13, sorting and collection are possible by changing the positions of the respective inner, middle and outer constituent members 131, 133 and 135 according to the liquid used in the processing. Thus, by sorting each liquid and discharging it to the corresponding waste liquid processing system, a plurality of liquids, the reuse and mixing of which are dangerous, can be sorted and processed.

Figure 6:
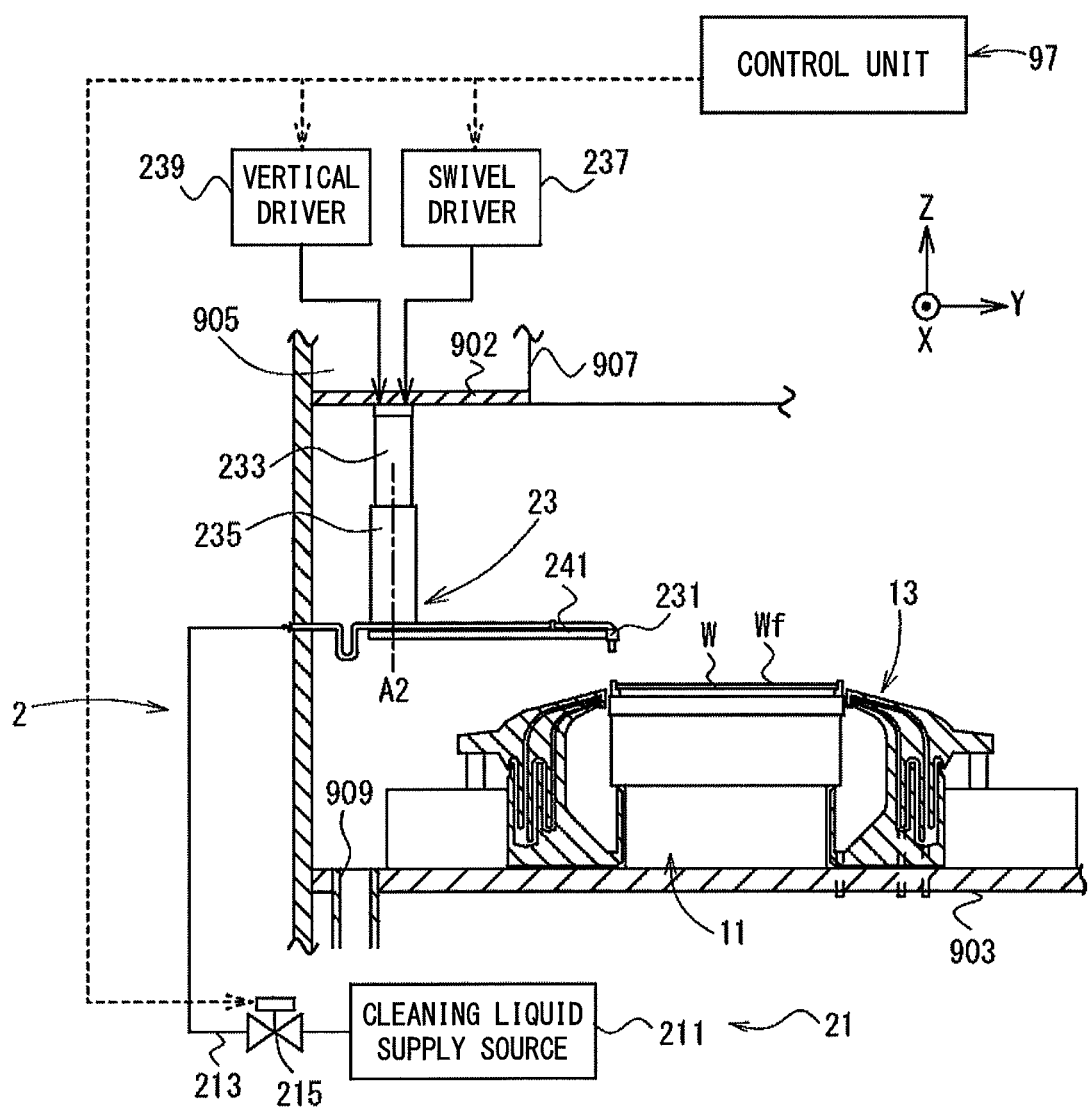
FIG. 6 is a diagram showing the configuration of a cleaning liquid discharger in the processing unit of FIG. 4.

Next, the configuration of the cleaning liquid discharger 2 is described using FIG. 6. FIG. 6 is a diagram showing the configuration of the cleaning liquid discharger 2.

The cleaning liquid discharger 2 includes the cleaning liquid discharge unit 23 for discharging the cleaning liquid to the substrate top surface Wf and the cleaning liquid supply unit 21 for supplying the cleaning liquid to the cleaning liquid discharge unit 23.

The cleaning liquid supply unit 21 includes a cleaning liquid supply source 211 configured by a tank or the like for storing the cleaning liquid, a pipe 213 connected to a nozzle 231 of the cleaning liquid discharge unit 23 to be described later and an on-off valve 215 disposed in the pipe 213 and configured to control the discharge of the cleaning liquid from the nozzle 231 by being opened and closed.

The on-off valve 215 is electrically connected to the control unit 97 and normally closed. The control unit 97 issues an operation command to control the opening and closing of the on-off valve 215.

The cleaning liquid for cleaning the substrate W is stored in the cleaning liquid supply source 211. In this embodiment, a mixed liquid of ammonium hydroxide, hydrogen peroxide solution and water (hereinafter, written as "SC-1") is used as the cleaning liquid.

Note that a chemical used as the cleaning liquid in the invention is not limited to SC-1 and a mixed liquid of chloride acid, hydrogen peroxide solution and water (hereinafter, written as "SC-2"), diluted hydrofluoric acid (hereinafter, written as "DHF"), a mixed liquid of sulfuric acid, hydrogen peroxide solution and water (hereinafter, written as "SPM") or deionized water (hereinafter, written as "DIW") may be used. Further, a plurality of these may be switchingly used.

Note that the cleaning liquid supply unit 21 may be provided inside or outside the substrate processing apparatus 9.

Next, the cleaning liquid discharge unit 23 is described. The cleaning liquid discharge unit 23 is a unit for discharging the cleaning liquid to the substrate top surface Wf and includes the nozzle 231 for discharging the cleaning liquid, an arm 241 for supporting the nozzle 231, a rotational swivel shaft 235 for moving the nozzle 231, a base member 233 fixed to the upper base member 902 and configured to support the rotational swivel shaft 235, a vertical driver 239 for vertically moving the rotational swivel shaft 235 and a swivel driver 237 for rotationally moving the rotational swivel shaft 235 about a rotation center axis A2.

The nozzle 231 is connected to the cleaning liquid supply source 211 via the pipe 213. When the control unit 97 issues an operation command to the on-off valve 215 to open the on-off valve 215, communication between the cleaning liquid supply source 211 and the nozzle 231 is ensured via the pipe 213 and the SC-1 is supplied to the substrate top surface Wf from the cleaning liquid supply source 211 via the pipe 213 and the nozzle 213.

The base member 233 is fixed to the upper base member 902 and vertically movably and rotatably supports the rotational swivel shaft 235 therebelow. Note that the base member 233 is configured into a hollow and substantially cylindrical shape to connect the rotational swivel shaft 235 to the vertical driver 239 and the swivel driver 237. One end of the arm 241 is bonded to the lower surface of the rotational swivel shaft 235 and the nozzle 231 is attached to the other end of the arm 241.

The rotational swivel shaft 235 is connected to the vertical driver 239 configured by a known driving mechanism such as a motor and a ball screw and the swivel driver 237 configured by a known driving mechanism such as a motor and a gear through the interior of the bae member 233.

The vertical driver 239 and the swivel driver 237 are electrically connected to the control unit 97. Further, the vertical driver 239 and the swivel driver 237 are arranged in the upper space 905.

When the control unit 97 issues an operation command to the vertical driver 239 to drive the vertical driver 239, the rotational swivel shaft 235 vertically moves and, associated with that, the nozzle 231 attached to the arm 241 also vertically moves. Further, when the control unit 97 issues an operation command to the swivel driver 237 to drive the swivel driver 237, the rotational swivel shaft 235 rotates about the rotation center axis A2 to swivel the arm 241, whereby the nozzle 231 attached to the arm 241 also swivels about the rotation center axis A2.

Figure 7:
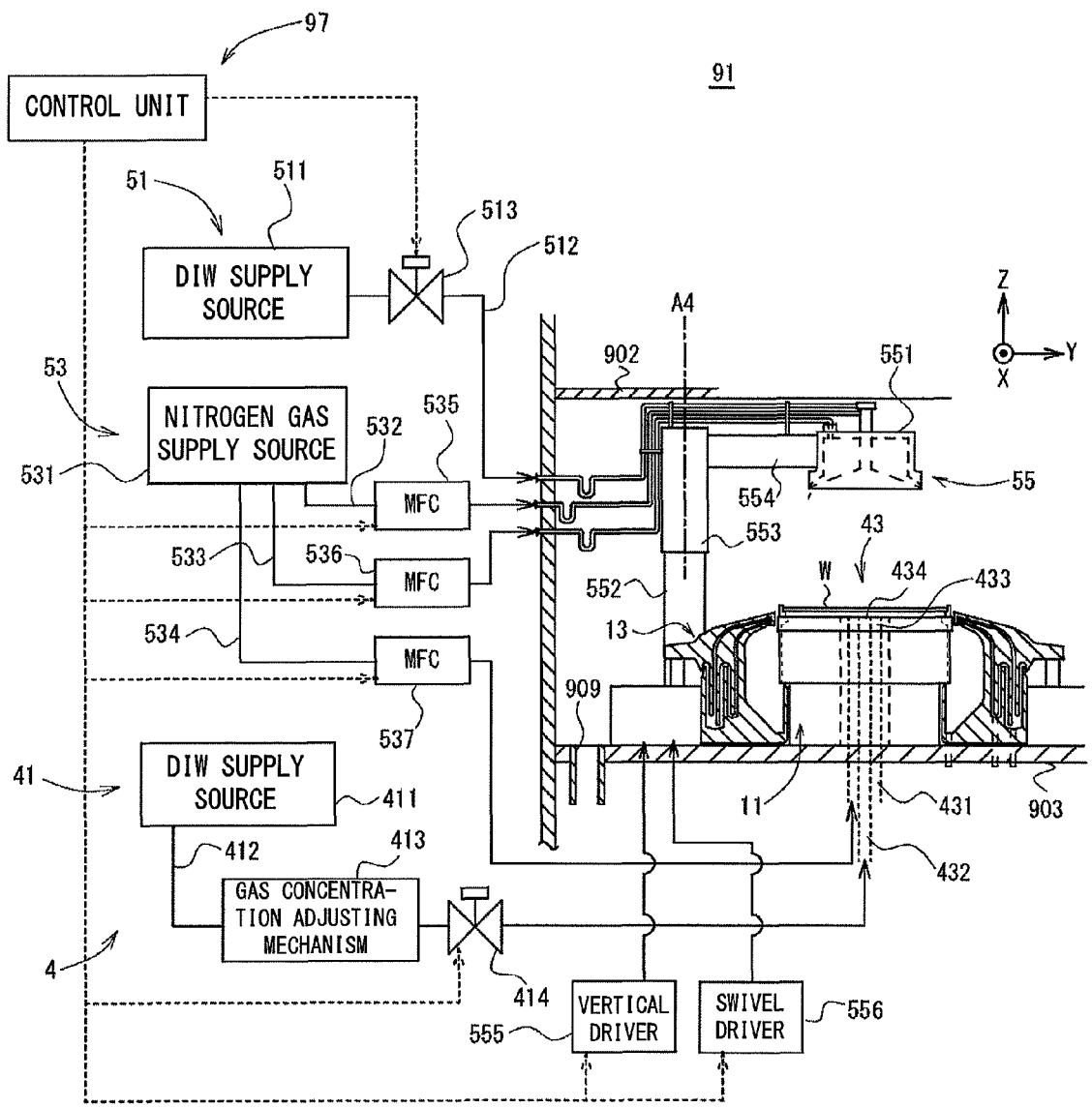
FIG. 7 is a diagram showing the configurations of a fluid injection unit and a first liquid discharger in the processing unit of FIG. 4.

Next, the fluid injection unit 55 and the first liquid discharger 4 are described. FIG. 7 is a diagram showing the configurations of the fluid injection unit 55 and the first liquid discharger 4.

The fluid injection unit 55 is a unit connected to each of a rinsing liquid supply unit 51 and a dry gas supply unit 53 and configured to rinse or dry the substrate top surface Wf by injecting the rinsing liquid or the dry gas to the substrate top surface Wf.

The rinsing liquid supply unit 51 includes a DIW supply source 511 configured by a tank or the like for storing DIW, a pipe 512 connected to a pipe 563 of an injection head 551 to be described later and an on-off valve 513 disposed in the pipe 512 and configured to control the communication of the pipe 512 by being opened and closed. The on-off valve 513 is electrically connected to the control unit 97 and normally closed. The control unit 97 issues an operation command to control the opening and closing of the on-off valve 513.

The DIW as the rinsing liquid for rinsing the substrate W is stored in the DIW supply source 511. Note that although the DIW is used as the rinsing liquid in this embodiment, there is no limitation to this in carrying out the invention and carbonated water or hydrogen water may be used as the rinsing liquid.

Note that the rinsing liquid supply unit 51 may be provided inside or outside the substrate processing apparatus 9.

The dry gas supply unit 53 is a unit for supplying the dry gas to the fluid injection unit 55. In this embodiment, nitrogen gas is used as the dry gas. The dry gas supply unit 53 includes a nitrogen gas supply source 531 for storing the nitrogen gas, a pipe 532 having one end connected to the nitrogen gas supply source 531 and the other connected to a pipe 564 to be described later, a mass flow controller 535 disposed in the pipe 532 and configured to control a flow rate of the nitrogen gas in the pipe 532, a pipe 533 having one end connected to the nitrogen gas supply source 531 and the other end connected to a pipe 572, a mass flow controller 536 disposed in the pipe 533 and configured to control a flow rate of the nitrogen gas in the pipe 533, a pipe 534 having one end connected to the nitrogen gas supply source 531 and the other connected to a pipe 431 to be described later, and a mass flow controller 537 disposed in the pipe 534 and configured to control a flow rate of the nitrogen gas in the pipe 534.

The nitrogen gas supply source 531 is configured by a tank or the like for storing the nitrogen gas. The nitrogen gas supply source 531 is provided with an unillustrated pressure feed pump. The pressure feed pump is electrically connected to the control unit 97. When the control unit 97 issues an operation command to the pressure feed pump, the pressure feed pump pressurizes the nitrogen gas in the nitrogen gas supply source 531 and supplies the nitrogen gas to the pipes 532, 533 and 534.

Note that although the pressure feed pump is used to supply the nitrogen gas to the pipes 532, 533 and 534 in this embodiment, there is no limitation to this in carrying out the invention and the nitrogen gas may be fed to the pipes 532, 533 and 534 from the nitrogen gas supply source 531 using the pressure of the nitrogen gas itself by storing the highly compressed nitrogen gas in the nitrogen gas supply source 531 without using the pressure feed pump.

Each of the mass flow controllers 535, 536 and 537 is electrically connected to the control unit 97. The control unit 97 independently issues an operation command to each of the mass flow controllers 535, 536 and 537 to drive the mass flow controllers 535, 536 and 537, whereby the flow rates of the nitrogen gas flowing to the pipes 564, 572 and 431 from the nitrogen gas supply source 531 can be adjusted to predetermined values in the respective pipes 532, 533 and 534. Further, when the flow rates in the mass flow controllers 535, 536 and 537 are respectively set to 0 by the control unit 97, the supply of the nitrogen gas to each of the pipes 564, 572 and 431 is stopped.

Next, the fluid injection unit 55 is described. The fluid injection unit 55 includes the injection head 551 for injecting the rinsing liquid and the dry gas, an arm 554 for supporting the injection head 551, a rotational swivel shaft 553 connected to the arm 554 and configured to move the injection head 551, a base member 552 fixed to the lower base member 903 and configured to support the rotational swivel shaft 553, a vertical driver 555 for vertically moving the rotational swivel shaft 553 and a swivel driver 556 for rotationally moving the rotational swivel shaft 553 about a rotation center axis A4.

The base member 552 is fixed to the lower base member 902 and the rotational swivel shaft 553 is vertically movably and rotatably supported above the base member 552. Note that the base member 552 is configured into a hollow and substantially cylindrical shape to connect the rotational swivel shaft 553 to the vertical driver 555 and the swivel driver 556. One end of the arm 554 is bonded to an upper part of the rotational swivel shaft 553 and the injection head 551 is attached to the other end of the arm 554.

The rotational swivel shaft 553 is connected to the vertical driver 555 configured by a known driving mechanism such as a motor and a ball screw and the swivel driver 556 configured by a known driving mechanism such as a motor and a gear through the interior of the base member 552.

The vertical driver 555 and the swivel driver 556 are electrically connected to the control unit 97. Further, the vertical driver 555 and the swivel driver 556 are arranged in the lower space 906.

When the control unit 97 issues an operation command to the vertical driver 555 to drive the vertical driver 555, the rotational swivel shaft 553 vertically moves and, associated with that, the injection head 551 attached to the arm 554 also vertically moves. Further, when the control unit 97 issues an operation command to the swivel driver 556 to drive the swivel driver 556, the rotational swivel shaft 553 rotates about the rotation center axis A4 to swivel the arm 554, whereby the injection head 551 attached to the arm 554 also swivels about the rotation center axis A4.

Figure 8:
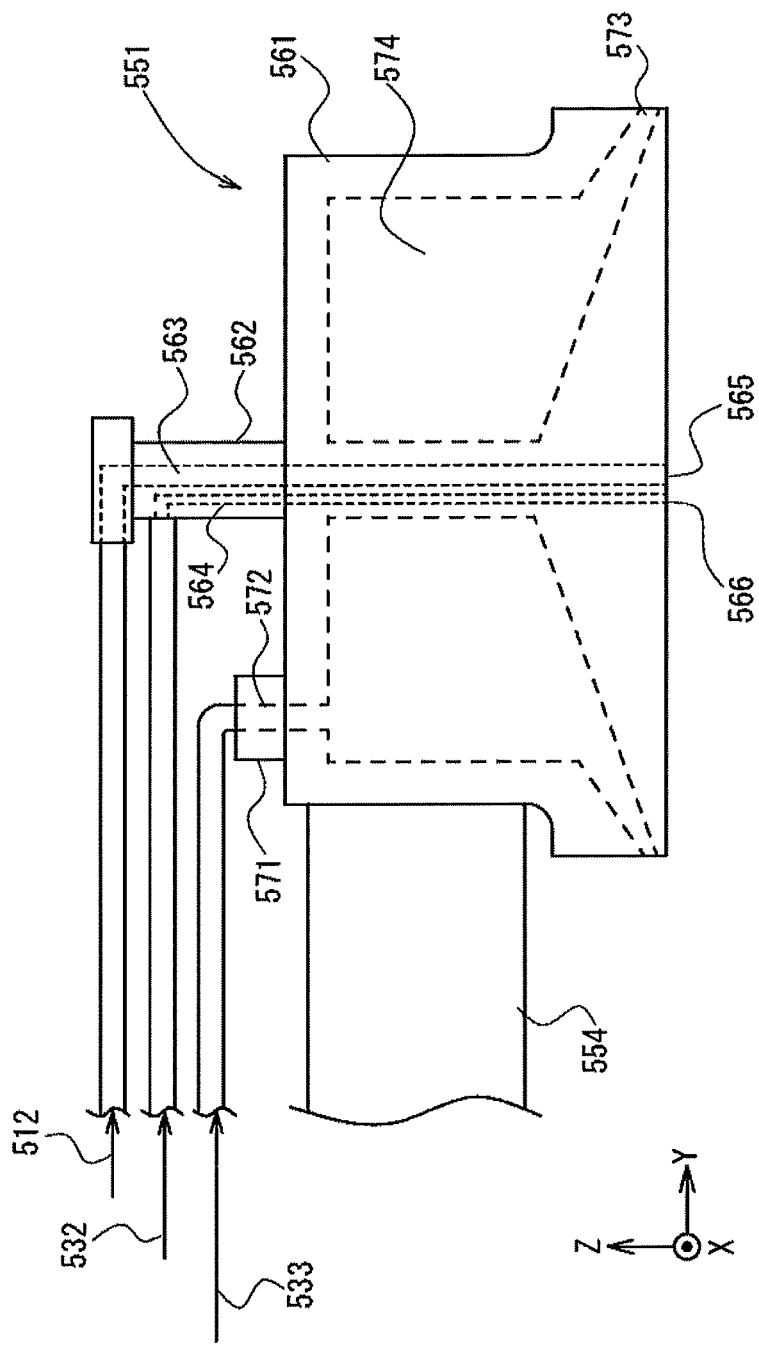
FIG. 8 is a schematic diagram showing the internal structure of the injection head of FIG. 7.

The injection head 551 is described using FIG. 8. FIG. 8 is a schematic diagram showing the internal structure of the injection head. The injection head 551 includes a head main body 561 and two fluid introducing portions 562, 571 stand on the head main body 561. Out of these, the fluid introducing portion 562 has a function of taking in the nitrogen gas fed under pressure from the external nitrogen gas supply source 531 and the DIW fed under pressure from the external DIW supply source 511. More specifically, the pipe 532 connected to the external nitrogen gas supply source 531 and the pipe 512 connected to the external DIW supply source 511 are connected to the fluid introducing portion 562. On the other hand, the fluid introducing portion 571 has only a function of taking in the nitrogen gas fed under pressure from the external nitrogen gas supply source 531.

Further, two supply passages 563, 564 vertically extend in the fluid introducing portion 562 and lower ends of the respective supply passages 563, 564 are open toward a substantial center of the substrate W on the lower surface (surface facing the substrate top surface Wf) of the injection head 551 and respectively function as a DIW discharge port 565 and a gas discharge port 566. Further, upper ends of the supply passages 563, 564 respectively communicate with the pipes 512, 532. Thus, when the control unit 97 issues an operation command to the on-off valve 513 to open the on-off valve 513, the DIW is supplied from the DIW supply source 511 to the injection head 551 and discharged from the DIW discharge port 565. Further, when the control unit 97 issues an operation command to the mass flow controller 535 to set the flow rate of the nitrogen gas, the nitrogen gas is supplied from the nitrogen gas supply source 531 to the injection head 551 according to a set value and discharged from the gas discharge port 566.

The other fluid introducing portion 571 provided in the injection head 551 includes a supply passage 572, which is connected to the pipe 535 which is connected to the nitrogen gas supply source 531 and in which the mass flow controller 536 is disposed. When the control unit 97 issues an operation command to the mass flow controller 536 to set a flow rate of the nitrogen gas, the nitrogen gas is guided from the nitrogen gas supply source 531 into a buffer space 574 formed in the injection head 551 via the supply passage 572 according to a set value. Further, a slit-like gas injection port 573 communicating with the buffer space 574 and extending substantially in a horizontal direction is provided on an outer peripheral part of the side surface of the head main body 561.

The nitrogen gas is injected to outside through the gas injection port 573 after being fed into the buffer space 574. At this time, since the nitrogen gas is pushed out through the slit-like gas injection port 573 extending substantially in the horizontal direction, the spread of the injected nitrogen gas is regulated in its range in the vertical direction and substantially isotropic in the horizontal direction (circumferential direction). That is, a laminar air flow flowing from a substantially central part toward a peripheral edge part is formed above the substrate W by injecting the nitrogen gas from the gas injection port 573. Particularly in this embodiment, the nitrogen gas fed under pressure is temporarily guided into the buffer space 574 and injected therefrom through the gas injection port 573. Thus, a uniform injection amount is obtained in the circumferential direction. Further, the pressurized nitrogen gas is injected through a small gap to increase a flow velocity, so that the nitrogen gas is injected with force to the surrounding. As a result, a nitrogen gas flow is injected from the periphery of the injection head 551 and the substrate top surface Wf is shielded from dirt, mist and the like falling down toward the substrate top surface Wf and outside atmosphere.

The thus configured injection head 551 is positioned between a facing position at a predetermined distance (e.g. about 2 to 10 mm) from the substrate top surface Wf of the substrate W held by the substrate holder 11 and a distant position distant from the substrate top surface Wf by the vertical driver 555 and the swivel driver 556.

Referring back to FIG. 7, the first liquid discharger is described next. The first liquid discharger includes the under surface discharger 43 for discharging the first liquid to the substrate under surface Wb and the first liquid supply unit 41 for supplying the first liquid to the under surface discharger 43.

The under surface discharger 43 is a duct for discharging the first liquid or the nitrogen gas as the dry gas to the substrate under surface Wb and has a double pipe structure provided in the substrate holder 11 and composed of an outer pipe 431 and an inner pipe 432. More specifically, the double pipe structure is formed by inserting the outer pipe 431 into a communication space extending from the upper surface of the spin base 113 of the substrate holder 11 to the lower space 906 through the central shaft 117 and inserting the inner pipe 432 into the outer pipe 431.

Upper end parts of the outer and inner pipes 431, 432 are open on a surface of the spin base 113 facing the substrate under surface Wb and respectively form an outer pipe discharge port 433 and an inner pipe discharge port 434.

A lower end part of the outer tube 431 is connected to the pipe 534 of the dry gas supply unit 53. When the control unit 97 issues an operation command to the mass flow controller 537 to set a flow rate of the nitrogen gas, the nitrogen gas is supplied from the nitrogen gas supply source 531 to the outer pipe 432 via the pipe 534 according to a set value and discharged toward the substrate under surface Wb from the outer pipe discharge port 433. A lower end part of the inner pipe 432 is connected to a pipe 412 of the first liquid supply unit 41 to be described later.

The first liquid supply unit 41 includes a DIW supply source 411 configured by a tank or the like for storing DIW, the pipe 412 connected to the inner pipe 432 of the under surface discharger 43, an on-off valve 414 disposed in the pipe 412 and configured to control the communication of the pipe 412 by being opened and closed, and a gas concentration adjusting mechanism 413 disposed in the pipe 412 and configured to dissolve the nitrogen gas in the DIW supplied from the DIW supply source 411.

The gas concentration adjusting mechanism 413 has a function of increasing a gas concentration in the DIW to about a saturation level by dissolving the nitrogen gas in the DIW supplied from the DIW supply source 411, thereby producing gas-enriched DIW. A configuration described in JP2004-79990A can be used as a specific configuration. If the dissolved gas concentration in the DIW is increased in this way, the generation and dissipation of air bubbles, i.e. cavitation is promoted by the application of ultrasonic waves to the DIW and an excellent cleaning effect is obtained. Accordingly, in this embodiment, the gas-enriched DIW (hereinafter, referred to as the "first liquid") is produced to obtain the above cleaning effect. Here, the first liquid can also be called a "cavitation promoting liquid" since it can promote cavitation more than DIW whose gas concentration is not increased.

Note that although the gas concentration adjusting mechanism 413 in this embodiment dissolves the nitrogen gas as the gas in the DIW, there is no limitation to this in carrying out the invention and another gas such as carbon dioxide, hydrogen gas, oxygen gas, ozone gas or air can also be used if it can promote cavitation. However, nitrogen gas does not have corrosiveness with respect to the substrate W and the pattern elements formed on the substrate W and furthermore the nitrogen gas is inert and relatively inexpensive. Thus, nitrogen gas is more preferably used as gas to be dissolved in the DIW.

The on-off valve 414 is electrically connected to the control unit 97 and normally closed. The control unit 97 issues an operation command to control the opening and closing of the on-off valve 414. When the control unit 97 issues an operation command to open the on-off valve 414, the first liquid fed under pressure from the gas concentration adjusting mechanism 413 is supplied to the inner pipe 432 of the under surface discharger 43 via the pipe 412 and discharged toward the substrate under surface Wb from the inner pipe discharge port 433.

In the first embodiment, the first liquid is discharged in a state where the substrate W is rotated by the substrate rotating mechanism 121 as described later. In this way, the first liquid discharged to the substrate under surface Wb spreads to the peripheral edge part of the substrate W by a centrifugal force and a liquid film Lb (see FIG. 14) is formed by the first liquid.

Specifically, in the first embodiment, the first liquid discharger 4 constitutes a "first liquid discharger" for discharging the first liquid (cavitation promoting liquid) to the other principal surface (substrate under surface Wb) of the substrate in the invention. Further, the spin base 113, the substrate holding members 115, the central shaft 117 and the substrate rotating mechanism 121 constitute a "liquid film former" in the invention.

Note that the first liquid supply unit 41 may be provided inside or outside the substrate processing apparatus 9.

Figure 9:
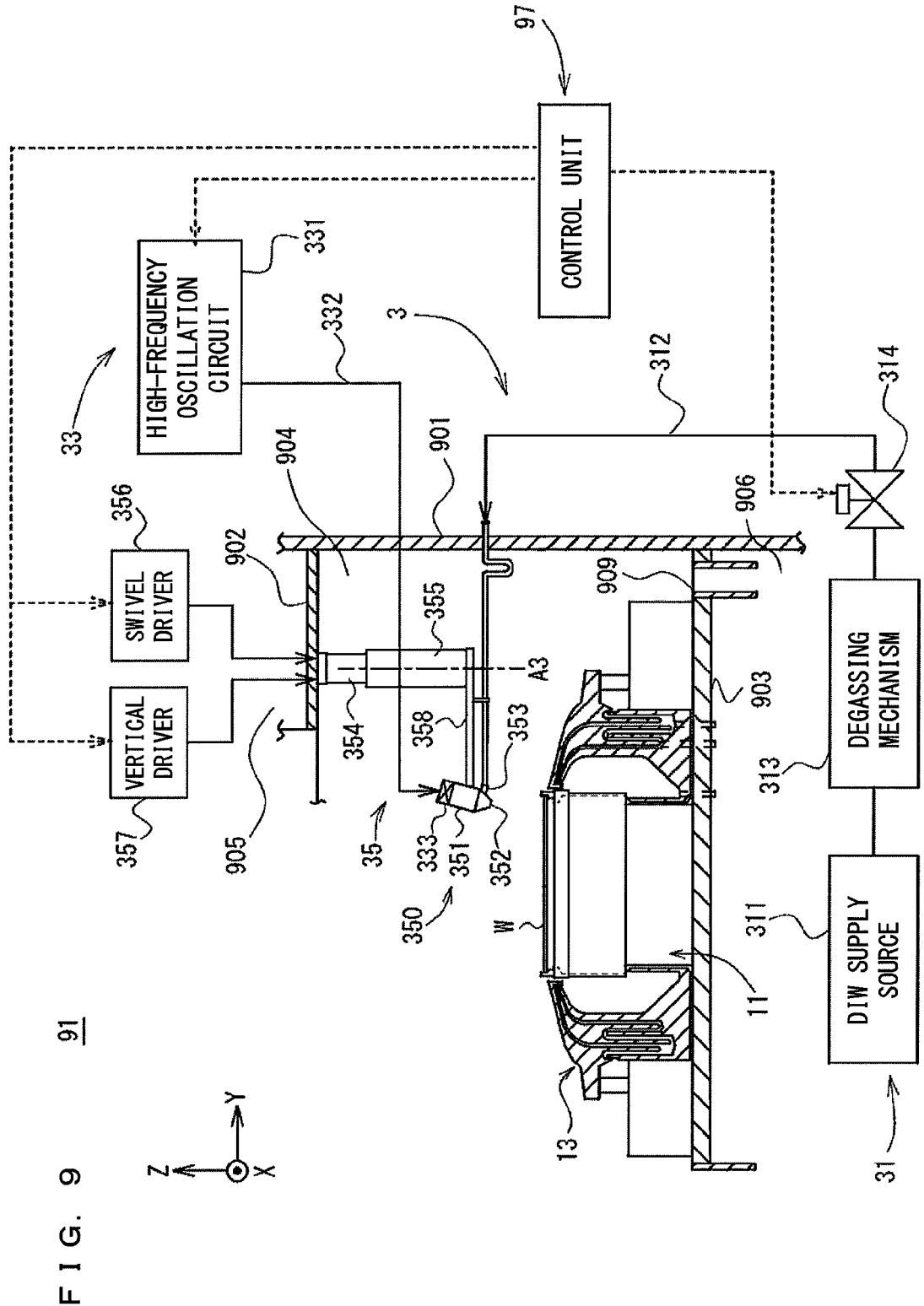
FIG. 9 is a diagram showing the configuration of a second liquid discharger in the processing unit of FIG. 4.

Next, the second liquid discharger 3 is described. FIG. 9 is a diagram showing the configuration of the second liquid discharger 3. The second liquid discharger 3 includes the ultrasonic wave applying unit 33 for applying ultrasonic waves to the second liquid, the second liquid discharge unit 35 for discharging the second liquid applied with ultrasonic waves to the substrate top surface Wf and the second liquid supply unit 31 for supplying the second liquid to the second liquid discharge unit 35.

The second liquid discharge unit 31 includes a DIW supply source 311 configured by a tank or the like for storing DIW, a pipe 312 connected to an introducing portion 353 of the second liquid discharge unit 35 to be described later, an on-off valve 314 disposed in the pipe 312 and configured to control the communication of the pipe 312 by being opened and closed, and a degassing mechanism 313 disposed in the pipe 312, located between the on-off valve 314 and the DIW supply source 311 and configured to degas the DIW supplied from the DIW supply source 311.

The degassing mechanism 313 is a mechanism for performing a degassing process of removing dissolved gas from the DIW fed from the DIW supply source 311 and reducing a dissolved gas concentration in the DIW. If the dissolved gas concentration in the DIW decreases, an occurrence rate of cavitation in the DIW decreases and cavitation intensity to be described later decreases. Note that, here, the liquid obtained by applying the degassing process to the DIW to reduce the cavitation intensity is referred to as the "second liquid" and the technical significance thereof is described later. The second liquid can be also called a "cavitation suppressing liquid" here since it can suppress cavitation more than the DIW, to which the degassing process is not applied.

The on-off valve 314 is electrically connected to the control unit 97 and normally closed. The control unit 97 issues an operation command to control the opening and closing of the on-off valve 314. When the control unit 97 issues an operation command to open the on-off valve 314, the second liquid fed under pressure from the degassing mechanism 313 is supplied to the introducing portion 353 of the second liquid discharge unit 35 via the pipe 312 and discharged to the substrate top surface Wf from a discharge port 352 to be described later after ultrasonic waves are applied by an oscillator 333 to be described later.

The ultrasonic wave applying unit 33 is a unit for applying ultrasonic waves to the second liquid and includes a high-frequency oscillation circuit 331, a wire 332 and the oscillator 333. The high-frequency oscillation circuit 331 is a circuit electrically connected to the control unit 97 and configured to generate a high-frequency signal based on a control signal from the control unit 97. The wire 332 is a known wire for inputting this high-frequency signal to the oscillator 333 and, for example, a coaxial cable is used. The oscillator 333 is built in a nozzle 350 to be described later and oscillates and generates ultrasonic waves based on the high-frequency signal when the high-frequency signal is input from the wire 332. The structure of the oscillator 333 is described in detail later.

The second liquid discharge unit 35 is a unit for discharging the second liquid applied with ultrasonic waves (hereinafter, written as "ultrasonic wave applying liquid") to the substrate top surface Wf. The second liquid discharge unit 35 includes the nozzle 350 for discharging the ultrasonic wave applying liquid, an arm 358 for supporting the nozzle 350, a rotational swivel shaft 355 for moving the nozzle 350, a base member 354 fixed to the upper base member 902 and configured to support the rotational swivel shaft 355, a vertical driver 357 for vertically moving the rotational swivel shaft 355 and a swivel driver 356 for rotationally moving the rotational swivel shaft 355 about a rotation center axis A3.

The nozzle 350 includes a nozzle main body 351, the introducing portion 353 connected to the pipe 312 and configured to introduce the second liquid as the cavitation suppressing liquid to the nozzle main body 351, and the discharge port 352 provided on the tip of the nozzle main body 351 and configured to discharge the ultrasonic wave applying liquid obtained by applying ultrasonic waves to the second liquid. Further, as described above, the oscillator 333 in the ultrasonic wave applying unit 33 is provided in the nozzle 350.

The base member 354 is fixed to the upper base member 902 and the rotational swivel shaft 355 is vertically movably and rotatably supported below the base member 354. Note that the base member 354 configured into a hollow and substantially cylindrical shape to connect the rotational swivel shaft 355 to the vertical driver 357 and the swivel driver 356. One end of the arm 358 is bonded to the lower surface of the rotational swivel shaft 355 and the nozzle 350 is attached to the other end of the arm 358.

The rotational swivel shaft 355 is connected to the vertical driver 357 configured by a known driving mechanism such as a motor and a ball screw and the swivel driver 356 configured by a known driving mechanism such as a motor and a gear through the interior of the base member 354.

The vertical driver 357 and the swivel driver 356 are electrically connected to the control unit 97. Further, the vertical driver 357 and the swivel driver 356 are arranged in the upper space 905.

When the control unit 97 issues an operation command to the vertical driver 357 to drive the vertical driver 357, the rotational swivel shaft 355 vertically moves and, associated with that, the nozzle 350 attached to the arm 358 also vertically moves. Further, when the control unit 97 issues an operation command to the swivel driver 356 to drive the swivel driver 356, the rotational swivel shaft 355 rotates about the rotation center axis A3 to swivel the arm 358, whereby the nozzle 350 attached to the arm 358 also swivels about the rotation center axis A3. A swiveling movement of the nozzle 350 is described in detail later.

Figure 10:
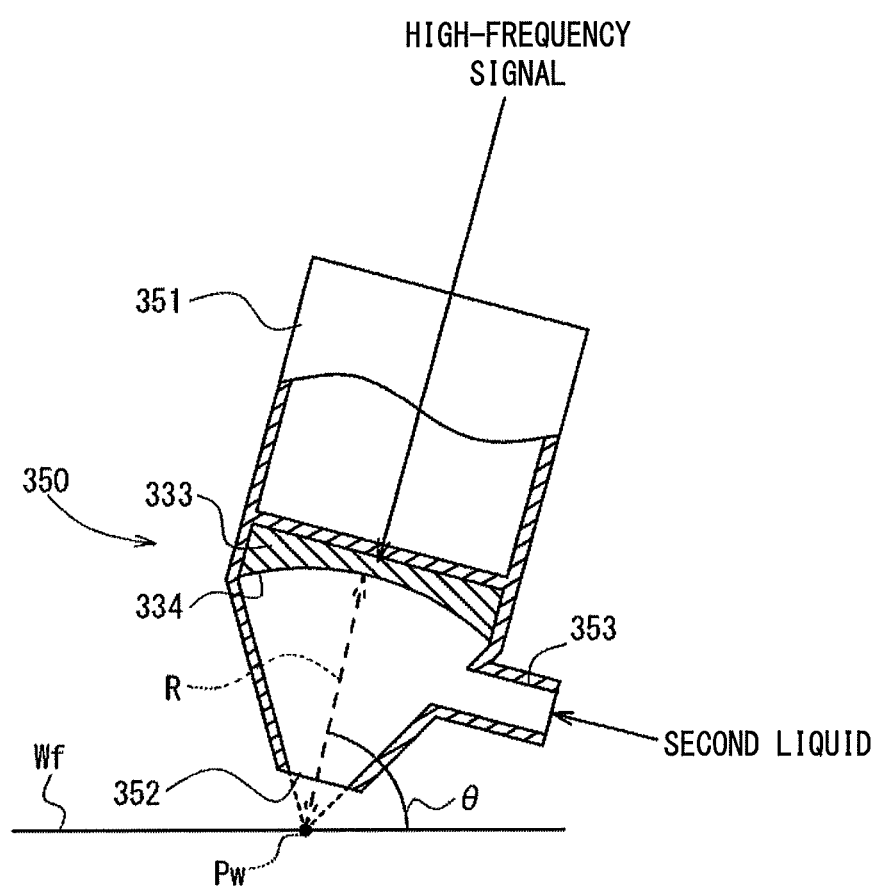
FIG. 10 is a diagram showing the configuration of a nozzle in the second liquid discharger of FIG. 9.

Here, the configuration of the nozzle 350 is described in detail using FIG. 10. FIG. 10 is a partial sectional view showing the configuration of the nozzle 350. The nozzle 350 is attached to a tip part of the arm 358 via an unillustrated direction adjuster. The direction adjuster is configured by a known driving mechanism such as a motor and a gear and can adjust an angle of incidence ($\theta$ in FIG. 10) of the ultrasonic wave applying liquid discharged from the nozzle 350 on the substrate W.

The nozzle 350 includes the conical nozzle main body 351 formed with the discharge port 352 for discharging the ultrasonic wave applying liquid on the tip. The introducing portion 353 for introducing the second liquid for applying ultrasonic waves into the nozzle main body 351 is provided on a side surface of this nozzle main body 351.

This introducing portion 353 is connected to the DIW supply source 311 via the pipe 312 as shown in FIG. 9. When the on-off valve 314 is opened in response to an operation command of the control unit 97, the nozzle 350 receives the supply of the DIW degassed through the degassing mechanism 313 (i.e. second liquid) from the DIW supply source 311 and discharges the second liquid from the discharge port 352 via the nozzle main body 351.

Further, when the control unit 97 issues an operation command to the ultrasonic wave applying unit 33 to operate the oscillator 333, the ultrasonic wave applying liquid obtained by applying ultrasonic waves to the second liquid is discharged from the discharge port 352. On the other hand, when the operation of the oscillator 333 is stopped in response to an operation command of the control unit 97, the second liquid having no ultrasonic wave applied thereto is discharged as it is from the discharge port 352.

Here, the structure of the oscillator 333 is described. In this embodiment, the oscillator 333 is configured by a piezoelectric element such as PZT (lead zirconate titanate). The oscillator 333 is an oscillator having an oscillation surface 334 on the side of the discharge port 352 finished into a concave shape having a radius of curvature R. When the oscillator 333 oscillates upon receiving a high-frequency signal from the high-frequency oscillation circuit 331 of FIG. 9, ultrasonic waves are applied to the second liquid in the nozzle main body 351 to produce the ultrasonic wave applying liquid. Further, since the oscillation surface 334 is a concave surface, ultrasonic waves converge to a point Pw located in a center of this concave surface. In this embodiment, the oscillation surface 334 is so designed that this point Pw is located outside and near the discharge port 352 and ultrasonic waves converge outside the discharge port 352. This point Pw corresponds to a "convergence point" of the invention.

Here, a swiveling movement of the nozzle 350 is described using FIG. 11. FIG. 11 is a schematic plan view of the interior of the processing unit 91 schematically showing the positions of the nozzle 350, the arm 358, the rotational swivel shaft 355 and the substrate W. The nozzle 350 can reciprocate between a position P1 above the substrate W on the rotation center axis A1 (hereinafter, written as a "center position P1") and a retracted position P4 lateral to the substrate W and outwardly of the cup 130 in the radius direction (see FIG. 5).

Since the nozzle 350 swivels about the rotation center axis A3 in the rotational swivel shaft 355, it successively passes through positions P2, P3 above the substrate W along a course T1 shown in FIG. 11 when being radially moved from the center position P1 toward the peripheral edge part of the substrate W. Here, the position P3 is above the peripheral edge part of the substrate W and written as a "peripheral edge position P3" below. Further, the position P2 is an arbitrary position above the substrate top surface Wf between the center position P1 and the peripheral edge position P3 on the course T1 and written as an "arbitrary position P2" below.

Note that the center position P1 needs not be located right on the rotation center axis A1 of the substrate W and an arrangement position of the nozzle 350 where the above point Pw outside and near the discharge port 352 of the nozzle 350 is located on the rotation center axis A1 on the substrate top surface Wf is expressed as the center position P1.

Here, in this embodiment, the vertical driver 357 shown in FIG. 9 adjusts the position of the nozzle 350 in a Z-axis direction to locate the point Pw on the substrate top surface Wf in response to an operation command of the control unit 97. Further, the position of the point Pw in XY directions is adjusted by driving the swivel driver 356 and the substrate rotating mechanism 121 as described above. Thus, in this embodiment, the vertical driver 357, the swivel driver 356 and the substrate rotating mechanism 121 constitute a "position adjuster" for adjusting the position of the convergence point in the invention. Further, the swivel driver 356 has a function as a moving mechanism for relatively moving the nozzle 350 with respect to the substrate W. Furthermore, the center position P1 and the peripheral edge position P3 respectively correspond to examples of a "first position" and a "second position" of the invention.

Similarly, the peripheral edge position P3 also needs not be located right above the peripheral edge part of the substrate W and an arrangement position of the nozzle 350 where the point Pw is located on the peripheral edge part of the substrate W is expressed as the peripheral edge position P3.

Next, the configuration of the control unit 97 is described using FIG. 12. FIG. 12 is a diagram showing the configuration of the control unit 97. The control unit 97 is electrically connected to each component of the substrate processing apparatus 9 and controls the operation of each component. The control unit 97 is configured by a computer including an arithmetic processing unit 973 and a memory 975. A CPU for performing various arithmetic processings is used as the arithmetic processing unit 973. Further, the memory 975 includes a ROM as a read-only memory for storing a basic program, a RAM as a freely writable and readable memory for storing various pieces of information and a magnetic disc for storing control software, data and the like. Substrate processing conditions corresponding to substrates W are stored as substrate processing programs 977 (also called recipes) in advance in the magnetic disc and the CPU reads out the content of the substrate processing program into the RAM and controls each component of the substrate processing apparatus 9 according to the content of the substrate processing program read out into the RAM. Note that an operation unit 971 (see FIG. 1) used to prepare/change the substrate processing program 977 and select a desired one out of a plurality of substrate processing programs 977 is connected to the control unit 97.

In the above description, the control unit 97 corresponds to a "controller" in the invention.

<1-3. Substrate Processing Processes>

Next, a substrate processing operation in the substrate processing apparatus 9 configured as described above is described. Here, uneven pattern elements are formed on the substrate W by a preceding process. The pattern elements form projections and recesses. In this embodiment, the projections have a height in a range of 100 to 200 nm and a width in a range of 10 to 20 nm. Further, a distance between adjacent projections (width of the recesses) is in a range of 10 to 1000 nm. Further, particles and the like produced during the formation of the pattern elements are adhering to the substrate top surface Wf and the substrate under surface Wb.

Note that although the substrate W formed with the pattern elements of the above scale is used in this embodiment, there is no limitation to this in carrying out the invention and pattern elements of a scale not included in the above ranges may be used and a substrate processing operation to be described later may be applied to the substrate W having no uneven pattern elements formed on a top surface.

Figure 13:
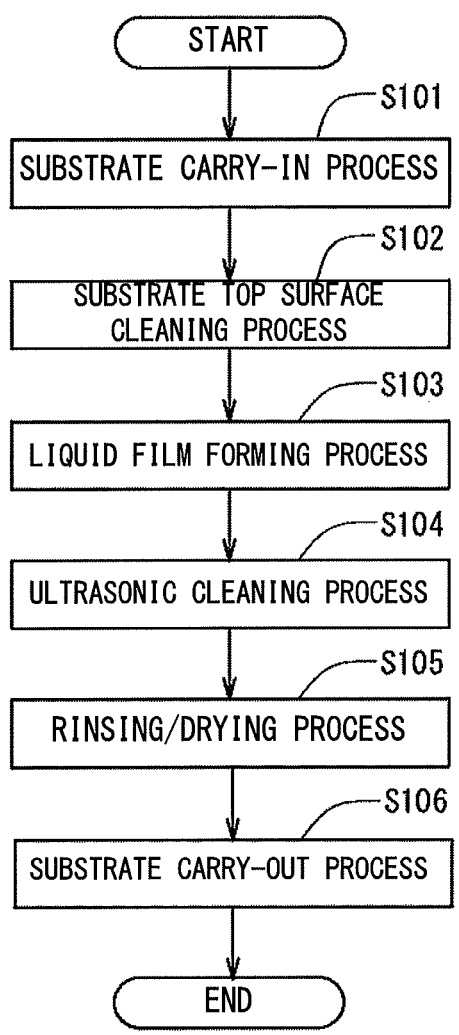
FIG. 13 is a flow chart showing the operation of the substrate processing apparatus according to a first embodiment.

Substrate processing processes are described below with reference to FIG. 13. FIG. 13 is a flow chart showing the overall operation of the substrate processing apparatus 9 in this embodiment.

First, the substrate processing program corresponding to predetermined substrates W is selected and the execution of this program is instructed. Thereafter, the control unit 97 issues an operation command to each component to perform the following operation as a preparation for carrying the substrate W into the processing unit 91.

As a preparatory operation, the rotation of the spin base 113 is first stopped in the substrate holder 11 and the spin base 113 is positioned at a position suitable for the transfer of the substrate W. Further, in the waste liquid collector 13, the cup 130 is positioned at the home position. After the spin base 113 is positioned at the position suitable for the transfer of the substrate W, the substrate holding members 115 are set to the open state.

Further, each of the nozzles 231, 350 is moved to the retracted position (position where each component is retracted outwardly of the cup 130 in the radius direction). Further, the injection head 551 is moved to the distant position. Furthermore, the on-off valves 215, 314, 414 and 513 are closed. Further, the mass flow controllers 535, 536 and 537 are set at a flow rate of 0 (zero).

After the preparation for carrying the substrate W into the processing unit 91 is completed, a substrate carry-in process (Step S101) of carrying an unprocessed substrate W into the processing unit 91 is performed. Specifically, the indexer robot 931 takes out the substrate W located at a predetermined position of the FOUP 949 on the opener 94 by the lower hand 933 and places it on the lower hand 951 of the shuttle 95. Thereafter, the lower hand 951 of the shuttle 95 is moved toward the center robot 96 and the center robot 96 picks up the substrate W on the lower hand 951 of the shuttle 95 by the lower hand 961.

Thereafter, the shutter 911 of the processing unit 91 is opened and the center robot 96 extends the lower hand 961 into the processing unit 91 to place the substrate W on the substrate supporting portions of the substrate holding members 115 of the substrate holder 11. When the conveyance of the substrate W into the processing unit 91 is finished, the center robot 96 contracts the lower hand 961 to take it out of the processing unit 91 and closes the shutter 911.

When the unprocessed substrate W is carried into the processing unit 91 and placed on the substrate supporting portions of the substrate holding members 115, the control unit 97 issues an operation command to the substrate holder 11 to set the substrate holding members 115 to the closed state. In this way, the substrate W is horizontally held with a substrate under surface Wb facing vertically downward (substrate holding process).

After the unprocessed substrate W is held by the substrate holder 11, a substrate top surface cleaning process (Step S102) of supplying the SC-1 as the cleaning liquid to a substrate top surface Wf is performed. First, the control unit 97 issues an operation command to the substrate holder 11 to start the rotation of the spin base 113 and maintain the rotation during the substrate top surface cleaning process (substrate rotating process). Further, the control unit 97 issues an operation command to the waste liquid collector 13 to position the cup 130 at the middle collection position. Note that the injection head 551 is kept at the distant position.

Here, a rotation speed of the substrate W is preferably set at 100 to 1000 rpm so that the cleaning liquid supplied to the substrate top surface Wf can be scattered over the entire substrate top surface Wf. In this embodiment, the rotation speed of the substrate W in the substrate top surface cleaning process is set at 200 rpm.

Subsequently, the control unit 97 issues an operation command to the cleaning liquid discharger 2 to position the nozzle 231 above the vicinity of a center of the substrate top surface Wf. After the positioning of the nozzle 231 is completed, the control unit 97 issues an operation command to the cleaning liquid discharger 2 to open the on-off valve 215. In this way, the SC-1 is discharged to the vicinity of the center of the substrate top surface Wf from the cleaning liquid supply source 211 via the pipe 213 and the nozzle 231.

The SC-1 supplied to the vicinity of the center of the substrate top surface Wf flows from the center of the substrate W toward the peripheral edge part of the substrate W to be scattered over the entire substrate top surface Wf by a centrifugal force generated by the rotation of the substrate W. In conjunction with this flow of the SC-1, the SC-1 enters even recesses of pattern elements formed on the substrate top surface Wf and removes particles and the like adhering to the substrate top surface Wf.

After the SC-1 is scattered over the entire substrate top surface Wf, the control unit 97 issues an operation command to the cleaning liquid discharger 2 to close the on-off valve 215. Further, the control unit 97 issues an operation command to the cleaning liquid discharger 2 to position the nozzle 231 at the retracted position (position where the nozzle 231 is retracted outwardly of the cup 130 in the radius direction).

Subsequently, the DIW is supplied to the substrate top surface Wf to which the SC-1 is adhering, thereby removing the SC-1 from the substrate top surface Wf. The DIW may be supplied from the second liquid discharger 3 or from the fluid injection unit 55. In this embodiment, the DIW is supplied to the substrate top surface Wf from the second liquid discharger 3 since a time for a process of positioning the second liquid discharger 3 and the like can be shortened in later Step S104.

The control unit 97 issues an operation command to the second liquid discharger 3 to position the nozzle 350 above the vicinity of the center of the substrate top surface Wf. This position may be the center position P1 where the nozzle 350 is so arranged that the convergence point Pw of ultrasonic waves is located on the rotation center axis A1 on the substrate top surface Wf (i.e. point on the substrate top surface Wf where the substrate top surface Wf and the rotation center axis A1 intersect) or may be a position above the center position P1 in the Z-axis direction. After the positioning of the nozzle 350 is completed, the control unit 97 issues an operation command to the second liquid discharger 3 to open the on-off valve 314. In this way, the DIW is discharged to the vicinity of the center of the substrate top surface Wf from the DIW supply source 311 via the pipe 312 and the nozzle 350. Here, the degassing mechanism 313 may be operated to supply the degassed DIW (second liquid) or the ultrasonic wave applying liquid obtained by applying ultrasonic waves to the second liquid by the ultrasonic wave applying unit 33 may be supplied. Alternatively, neither the degassing mechanism 313 nor the ultrasonic wave applying unit 33 may be operated and the DIW may be supplied as it is to the substrate top surface from the DIW supply source 311.

Note that, in this embodiment, the degassing mechanism 313 and the ultrasonic wave applying unit 33 are operated to supply the ultrasonic wave applying liquid to the substrate top surface Wf in order to satisfactorily remove the SC-1 remaining in the recesses and the like of the pattern elements by ultrasonic vibration.

Subsequently, a liquid film forming process (Step S103) of forming a liquid film of the first liquid on the substrate under surface Wb is performed. First, the control unit 97 issues an operation command to the waste liquid collector 13 to position the cup 130 at the outer collection position. Further, the fluid injection unit 55 is kept at the distant position. The supply of the DIW from the nozzle 350 performed in Step S102 may be maintained or may be stopped.

Note that, in this embodiment, the supply of the ultrasonic wave applying liquid to the vicinity of the center of the substrate top surface Wf from the nozzle 350 is maintained continually from Step S102 to prevent the formation of water marks caused by natural drying of the substrate top surface Wf.

A rotation speed of the substrate W in the liquid film forming process needs to be set at an optimal rotation speed so that the first liquid supplied to the substrate under surface Wb can be scattered over the entire substrate under surface Wb and the liquid film of the first liquid can be formed on the substrate under surface Wb. This is because the first liquid is not scattered over the entire surface if the rotation speed is slower than the optimal speed and the first liquid supplied to the substrate under surface Wb is immediately scattered toward the peripheral edge part of the substrate W without forming the liquid film if the rotating speed is faster than the optimal speed. Further, a flow rate of the first liquid supplied to the substrate under surface Wb also needs to be set at a predetermined flow rate or higher for the formation of the liquid film.

In this embodiment, the rotation speed of the substrate W is preferably set in a range of 100 rpm or higher and 1000 rpm or lower so that the liquid film of the first liquid can be formed on the substrate under surface Wb. Further, the flow rate of the first liquid supplied to the substrate under surface Wb from the under surface discharger 43 is preferably set at 0.5 L/m or higher. In this embodiment, the rotation speed of the substrate W is set at 200 rpm and the flow rate of the first liquid is set at 1.5 L/m in the liquid film forming process.

The control unit 97 issues an operation command to the substrate holder 11 to set the rotation speed of the substrate W at 200 rpm. Then, the control unit 97 issues an operation command to the first liquid discharger 4 to open the on-off valve 414.

In this way, the first liquid obtained by dissolving the nitrogen gas in the DIW is supplied to the substrate under surface Wb from the first liquid supply unit 41 via the inner pipe 432 and the inner pipe discharge port 434. The first liquid supplied to the vicinity of the center of the substrate under surface Wb flows from the vicinity of the center of the substrate W toward the peripheral edge part due to a centrifugal force caused by the rotation of the substrate W and finally flies out of the substrate W from the peripheral edge part of the substrate W to be collected and drained by the waste liquid collector 13.

FIG. 14 is a diagram showing a state where the liquid film is formed on the substrate under surface Wb in the liquid film forming process. By the rotation of the substrate W, the first liquid supplied to the vicinity of the center of the substrate under surface Wb is scattered toward the peripheral edge part of the substrate W and the liquid film Lb of the first liquid is formed on the substrate under surface Wb.

After the liquid film forming process is performed, the ultrasonic wave applying liquid is supplied to the substrate top surface Wf from the nozzle 350 and the nozzle 350 moves along the course T1 (see FIG. 11) above the substrate top surface Wf (i.e. scans the substrate top surface Wf), thereby performing an ultrasonic cleaning process (Step S104) of ultrasonically cleaning the entire substrate under surface Wb is performed.

When the ultrasonic cleaning process is started, the control unit 97 first issues an operation command to the waste liquid collector 13 to keep the cup 130 at the outer collection position. Further, the fluid injection unit 55 is kept at the distant position. The rotation speed of the substrate W by the substrate holder 11 is kept at 200 rpm in the liquid film forming process (Step S103) and the supply of the first liquid to the substrate under surface Wb is also kept at a flow rate of 1.5 L/m. In this way, the formation of the liquid film of the first liquid is maintained continually from Step S103. Further, the supply of the ultrasonic wave applying liquid from the nozzle 350 is maintained continually from Step S103.

Subsequently, the control unit 97 issues an operation command to the second liquid discharger 3 to operate the direction adjuster and set the angle of incidence (see FIG. 10) at $\theta 1$. This angle of incidence $\theta 1$ is written as a "processing angle $\theta 1$" below. Further, the control unit 97 issues an operation command to the second liquid discharger 3 to drive the vertical driver 357 and position the point Pw (see FIG. 10) as the convergence point on the substrate top surface Wf on the rotation center axis A1. Specifically, the nozzle 350 is positioned at the center position P1.

Note that the supply of the ultrasonic wave applying liquid may be temporarily stopped or may be maintained during the above positioning of the nozzle 350 to the center position P1. In this embodiment, the nozzle 350 is positioned at the center position P1 in a state where the supply of the ultrasonic wave applying liquid is maintained. Further, if the nozzle 350 is already positioned at the center position P1 and the angle of incidence is already set at the processing angle $\theta 1$ in the substrate top surface cleaning process (Step S102), it is not necessary to readjust the position and the angle of incidence of the nozzle 350 and the control unit 97 issues an operation command to the second liquid discharger 3 to maintain the center position P1 and the processing angle $\theta 1$.

Figure 15:
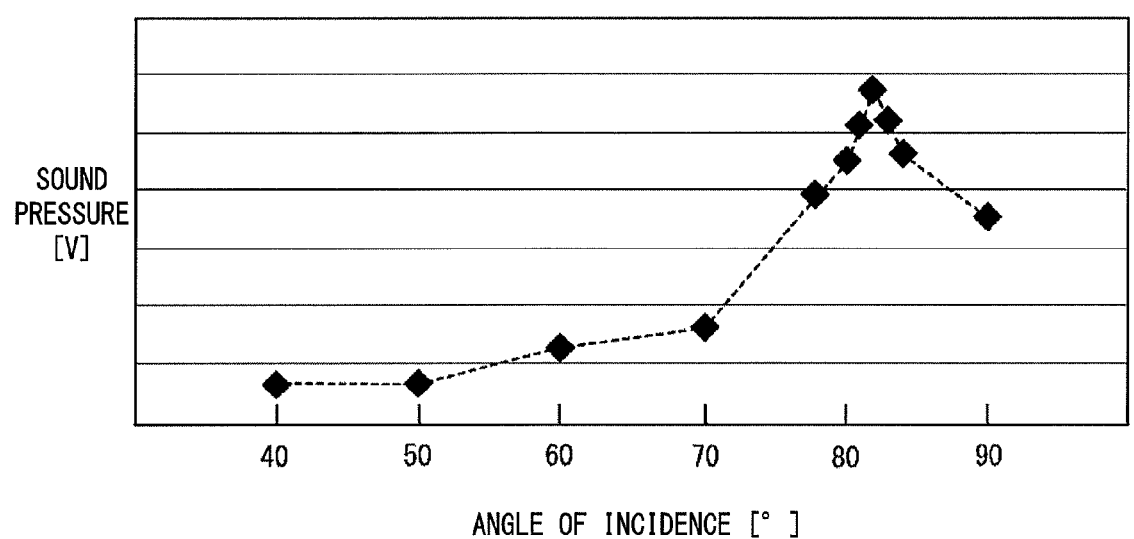
FIG. 15 is a graph showing a relationship between an incidence angle of an ultrasonic wave applying liquid from the nozzle and a sound pressure applying onto a substrate under surface.

Here, the significance of the processing angle $\theta 1$ of the nozzle 350 with respect to the substrate W is described. FIG. 15 is a graph showing a relationship between the intensity of ultrasonic vibration transmitted to the substrate under surface Wb (sound pressure) and the angle of incidence $\theta$ when the ultrasonic wave applying liquid is supplied from the substrate top surface Wf. In a measurement, an ultrasonic wave applying liquid having an ultrasonic output of 20 W was supplied at a flow rate of 1.5 L/m from the substrate top surface Wf, a hydrophone was arranged on the substrate under surface Wb and a sound pressure was measured by this hydrophone. The sound pressure is confirmed to clearly depend on the angle of incidence $\theta$. More specifically, the sound pressure is maximized at the angle of incidence $\theta=82°$.

In ultrasonic cleaning, a stronger cleaning force is obtained as the sound pressure applied to the substrate W increases. Thus, in order to satisfactorily clean the substrate under surface Wb, the angle of incidence $\theta$ is desirably set in a range of 75° to 90°, further preferably at 82° from the graph of FIG. 15. As just described, considering angle dependency, it is desirable to adjust the angle of the nozzle 350 with respect to the arm 358 and a direction of supplying the ultrasonic wave applying liquid to the substrate top surface Wf (angle of incidence $\theta$) by the direction adjuster.

From the above, the processing angle $\theta 1$ is set at 82° in this embodiment. However, the optimal angle of incidence θ changes every time, depending on various conditions such as the shape of the nozzle 350 and an ultrasonic vibration output. Thus, the processing angle θ1 is not limited to 82° in carrying out the invention and may be selected for each apparatus by measuring the angle of incidence θ, at which the sound pressure is maximized as shown in FIG. 15, for each apparatus. Therefore, the direction adjuster is provided between the nozzle 350 and the arm 358 so as to be able to cope with any processing angle θ1.

Subsequently, the control unit 97 issues an operation command to the second liquid discharger 3 to operate the swivel driver 356 and move the nozzle 350 from the center position P1 to the peripheral edge position P3 along the course T1. At this time, the processing angle θ1 with respect to the substrate top surface Wf is maintained. Since the substrate W is rotated about the rotation center axis A1 by the substrate holder 11, the nozzle 350 can locate the point Pw at any position on the entire substrate top surface WF by moving from the center position P1 to the peripheral edge position P3 along the course T1. Specifically, the nozzle 350 can scan the entire substrate top surface Wf by the swiveling movement of the nozzle 350 by the swivel driver 356 and the rotational movement of the substrate W by the substrate holder 11.

As described above, the nozzle 350 supplies the ultrasonic wave applying liquid to the substrate top surface Wf by successively locating the point Pw on the entire substrate top surface Wf, whereby ultrasonic vibration is transmitted from the ultrasonic wave applying liquid from the substrate top surface Wf to the substrate under surface Wb and the liquid film Lb formed on the substrate under surface Wb via the substrate W. This ultrasonic vibration is strongest at the point Pw as the convergence point and attenuated with distance from the point Pw.

On the substrate under surface Wb, ultrasonic vibration is most strongly transmitted at an underside position right below the position of the substrate top surface Wf where the point Pw is located and attenuated with distance from this underside position. When ultrasonic vibration is transmitted to the substrate under surface Wb, it is subsequently transmitted from the substrate under surface Wb to the liquid film Lb.

When ultrasonic waves are applied to the liquid film Lb, cavitation is caused by the nitrogen gas dissolved in the liquid and particles and the like adhering to the substrate under surface Wb are separated from the substrate under surface Wb by cavitation energy. The separated particles and the like are mixed with the liquid film Lb, carried toward the peripheral edge part of the substrate W with the rotation of the substrate W and finally flown away together with the first liquid constituting the first liquid film Lb and collected by the waste liquid collector 13, thereby being removed from the substrate under surface Wb. In this way, the substrate under surface Wb is cleaned.

Further, the first liquid constituting the liquid film Lb has a higher intensity of cavitation caused by the application of ultrasonic waves as compared with the DIW whose nitrogen gas concentration is not increased to about a saturation level since the nitrogen gas concentration in the liquid is increased to about the saturation level by the gas concentration adjusting mechanism 413. This can apply stronger energy to the particles and the like adhering to the substrate under surface Wb and can also satisfactorily remove small particles and the like having a stronger adhesion force to the substrate under surface Wb.

Further, the larger the applied ultrasonic vibration, the stronger the cavitation intensity. Thus, on the substrate under surface Wb, ultrasonic vibration is most strongly transmitted at the underside position right below the position of the substrate top surface Wf where the point Pw is located, wherefore the particles and the like can be most satisfactorily removed at this underside position. Since the nozzle 350 can scan the entire substrate top surface Wf by the swiveling movement of the nozzle 350 by the swivel driver 356 and the rotational movement of the substrate W by the substrate holder 11 and can locate the point Pw on the entire substrate top surface Wf in this embodiment, the particles and the like can be satisfactorily removed from the entire substrate under surface Wb.

Since the ultrasonic wave applying liquid is supplied to the substrate top surface Wf in this embodiment, there is a possibility of damaging the pattern elements formed on the substrate top surface Wf. However, since the second liquid supplied to the substrate top surface Wf is obtained by reducing the dissolved gas concentration in the DIW by the degassing mechanism 313 as described above, the intensity of the cavitation caused by the application of ultrasonic waves is weaker as compared with the DIW to which the degassing process is not applied. In this way, weaker energy is applied to the pattern elements formed on the substrate top surface Wf and the collapse of the pattern elements due to the cavitation energy can be suppressed as compared with the case where the degassing process is not performed.

Here, the "cavitation intensity" means a stress per unit area acting on the substrate W by the cavitation caused in the liquid by ultrasonic waves and is determined by a cavitation coefficient α and bubble collapse energy U. Specifically, the cavitation coefficient is obtained by (Equation 1) and the smaller the cavitation coefficient α, the higher the cavitation intensity.

$$\alpha = (Pe - Pv)/(\rho V^2/2) \quad \text{(Equation 1)}$$

Here, Pe denotes atmospheric pressure, Pv denotes steam pressure, ρ denotes density and V denotes flow velocity.

Further, the bubble collapse energy U is obtained by (Equation 2) and the larger the bubble collapse energy U, the higher the cavitation intensity.

$$U = 4\pi r^2 \sigma = 16\pi \sigma^3/(Pe-Pv)^2 \quad \text{(Equation 2)}$$

Here, r denotes bubble radius before collapse and a denotes surface tension.

In this embodiment, the first liquid having a function as the cavitation promoting liquid has the nitrogen gas concentration increased to the saturation level, whereby the stream pressure Pv increases and the cavitation coefficient α decreases, whereas the bubble collapse energy U increases and the cavitation intensity of the first liquid increases. As a result, the particles and the like can be separated from the substrate W and more satisfactorily removed by causing a stronger stress to act on the particles and the like when ultrasonic vibration is transmitted to the substrate under surface Wb and the liquid film Lb from the substrate top surface Wf.

Further, since the second liquid having a function as the cavitation suppressing liquid has the dissolved gas concentration suppressed low by the degassing process in this embodiment, the stream pressure Pv is drastically reduced. Thus, the cavitation coefficient α increases, whereas the bubble collapse energy U decreases and the cavitation intensity of the second liquid decreases. As a result, ultrasonic waves are transmitted also to the substrate top surface Wf during the above cleaning of the substrate under surface Wb, but a stress acting on the pattern elements is suppressed low by suppressing the cavitation intensity low, wherefore the damage of the pattern elements on the substrate top surface Wf due to the application of ultrasonic waves can be effectively suppressed.

Figure 16:
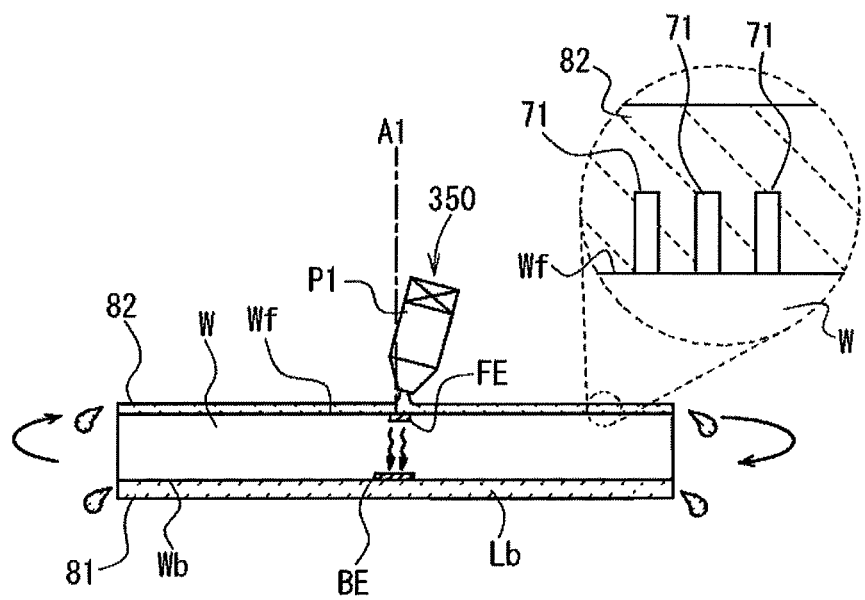

Here, the transmission of ultrasonic waves on the substrate top surface Wf and the substrate under surface Wb is described using FIGS. 16 to 18.

FIG. 16 is a diagram showing a state where the nozzle 350 is located at the center position P1 in the ultrasonic cleaning process (Step S104) and also showing an enlarged view of pattern elements 71 formed on the substrate top surface Wf. FIGS. 17 and 18 are diagrams respectively showing states where the nozzle 350 is located at the arbitrary position P2 and at the peripheral edge position P3 likewise in the ultrasonic cleaning process.

As shown in FIG. 16, when the ultrasonic cleaning process is started, an ultrasonic wave applying liquid 82 is supplied to the substrate top surface Wf from the nozzle 350 positioned at the center position P1 in a state where a liquid film Lb of the first liquid 81 is formed on the substrate under surface Wb. At this time, a partial area of the substrate top surface Wf where the ultrasonic wave applying liquid 82 from the nozzle 350 is directly sprayed is expressed as a "directly sprayed area FE". At the center position P1, the convergence point Pw of the ultrasonic vibration is located in the directly sprayed area FE. Thus, this area is an area where the ultrasonic vibration is most strongly transmitted and the ultrasonic vibration is attenuated with distance from the directly sprayed area FE.

Further, a partial area of the substrate under surface Wb right below the directly sprayed area FE is referred to as a "directly transmitted area BE". On the substrate under surface Wb, the ultrasonic vibration is most strongly transmitted in the directly transmitted area BE, which is an area of the substrate under surface Wb right below the directly sprayed area FE where the point Pw is located, and the ultrasonic vibration is attenuated with distance from the directly transmitted area BE.

Note that the ultrasonic vibration is radially transmitted from the directly sprayed area FE according to a thickness of the substrate W when being transmitted from the substrate top surface Wf to the substrate under surface Wb via the substrate W. Thus, the directly transmitted area BE can be a wider area than the directly sprayed area FE.

In this directly transmitted area BE, the substrate under surface Wb is more satisfactorily cleaned. Further, the ultrasonic wave applying liquid is a liquid obtained by applying ultrasonic waves to the second liquid and the cavitation intensity is suppressed low as described above. Thus, the collapse of the pattern elements 71 formed on the substrate top surface Wf is also suppressed.

Subsequently, as shown in FIG. 17, the control unit 97 issues an operation command to the second liquid discharger 3 to operate the swivel driver 356 and move the nozzle 350 from the center position P1 to the arbitrary position P2 along the course T1. Since the rotation of the substrate W by the substrate holder 11 is maintained from the liquid film forming process (Step S103), the directly sprayed area FE on the substrate top surface Wf draws a circular locus centered on the rotation center axis A1 on the substrate under surface Wb with the rotation of the substrate W as shown in FIG. 17 when the nozzle 350 supplies the ultrasonic wave applying liquid at the arbitrary position P2. Similarly, the directly transmitted area BE also draws a circular locus centered on the rotation center axis A1 on the substrate under surface Wb.

Further, when the swivel driver 356 is operated to move the nozzle 350 from the arbitrary position P2 to the peripheral edge position P3 along the course T1, the directly sprayed area FE draws a locus along the peripheral edge part of the substrate W as shown in FIG. 18. Similarly, the directly transmitted area BE also draws a locus along the peripheral edge part of the substrate W. Although the directly sprayed area FE and the directly transmitted area BE are shown at different positions in FIG. 18, the directly sprayed area FE and the directly transmitted area BE approach each other toward the peripheral edge part and the two areas may possibly become indistinguishable at an end part if the peripheral edge part of the substrate W to be cleaned is not rectangular as shown in FIG. 18, but semi-circular. Specifically, only the directly sprayed area FE can be possibly present at the outermost part of the peripheral edge part.

Note that the nozzle 350 may be moved with respect to the substrate W along the course T1 only from the center position P1 to the peripheral edge position P3 or the supply of the ultrasonic wave applying liquid may be maintained while the nozzle 350 reciprocally moves between the center position P1 and the peripheral edge position P3 along the course T1 a plurality of times. Alternatively, the entire substrate top surface Wf may not be scanned. Specifically, after being moved from the center position P1 to the arbitrary position P2 along the course T1, the nozzle 350 may be returned to the center position P1 without being moved to the peripheral edge position P3. Further, the moving speed of the nozzle 350 with respect to the substrate W and a supply time of the ultrasonic wave applying liquid to each directly sprayed area FE may not be uniform. If it is desired to clean a predetermined area of the substrate under surface Wb intensively, the nozzle 350 may be kept longer at the arbitrary position P2 corresponding to this predetermined area. These scanning conditions may be appropriately set according to a removal rate of particles and the like and other factors required for the substrate under surface Wb.

When the removal of the particles and the like on the substrate under surface Wb is completed by the above ultrasonic cleaning process, a rinsing/drying process (Step S105) of drying the substrate W after removing the DIW adhering to the substrate top surface Wf and the substrate under surface Wb by the rinsing liquid is subsequently performed.

When the rinsing/drying process is started, the control unit 97 first issues an operation command to each component to perform the following operation. First, the oscillation of the oscillator 333 in the nozzle 350 of the second liquid discharger 3 is stopped and the application of ultrasonic waves to the second liquid is stopped. Subsequently, the on-off valve 314 of the second liquid discharger 3 and the on-off valve 414 of the first liquid discharger 4 are respectively closed, and the discharge of the first and second liquids to the substrate top surface Wf and the substrate under surface Wb is stopped. Subsequently, the nozzle 350 is positioned at the retracted position P4. The rotation of the substrate W by the substrate holder 11 is maintained.

Then, the control unit 97 issues an operation command to the fluid injection unit 55 to position the injection head 551 at a position facing the substrate top surface Wf. Subsequently, the control unit 97 issues an operation command to the rinsing liquid supply unit 51 to open the on-off valve 513 and supply the DIW as the rinsing liquid from the DIW supply source 511 to the substrate top surface Wf through the DIW discharge port 565 via the pipe 512. Further, the control unit 97 issues an operation command to the dry gas supply unit 53 to set the mass flow controller 536 at a predetermined flow rate, whereby the nitrogen gas is supplied into the buffer space 574 and the injection of the nitrogen gas from the gas injection port 573 provided on the periphery of the head main body 561 is started.

Since a flow velocity of the nitrogen gas supplied from the gas injection port 573 is fast and an injection direction is restricted in the vertical direction, a curtain of the nitrogen gas radially flowing from a central part toward the surrounding is formed above the substrate W. This curtain has an effect of shielding atmosphere near the substrate top surface Wf and outside atmosphere and the substrate top surface Wf can be rinsed while the adhesion of contaminants from the outside atmosphere is prevented.

When the rinsing of the substrate top surface Wf is completed, the on-off valve 513 is closed and the supply of the DIW as the rinsing liquid to the substrate top surface Wf is stopped in response to an operation command of the control unit 97. Subsequently, by setting a predetermined flow rate in each of the mass flow controllers 535, 537, the nitrogen gas is supplied to the substrate top surface Wf and the substrate under surface Wb from the gas discharge port 566 and the outer pipe discharge port 433.

Further, the injection of the nitrogen gas from the gas injection port 573 is maintained and the formation of the curtain of the nitrogen gas having a high flow velocity from the gas injection port 573 is maintained. On the other hand, a flow velocity of the nitrogen gas supplied from the gas discharge port 566 is slower than this and the flow rate of this nitrogen gas is limited by the mass flow controller 535 so as not to form a strong flow toward the substrate top surface Wf. Thus, the nitrogen gas supplied from the gas discharge port 566 acts to purge air remaining in a space enclosed by a curtain-like gas layer injected from the gas injection port 573 and the substrate top surface Wf and keep this space at nitrogen atmosphere. Here, the nitrogen gas supplied from the gas injection port 573 is referred to as "gas for curtain" and the nitrogen gas discharged from the gas discharge port 566 is referred to as "gas for purging".

In a state where the curtain of the nitrogen gas is formed above the substrate W and the substrate top surface Wf is kept in nitrogen atmosphere in this way, the control unit 97 issues an operation command to the substrate holder 11 to increase the rotation speed of the substrate W. In this embodiment, this rotation speed is 800 rpm. By rotating the substrate W at a high speed, the DIW adhering to the substrate top surface Wf and the substrate under surface Wb is spun off to dry the substrate W. During the execution of the drying process, the supply of the gas for curtain and the gas for purging is continued, thereby preventing the adhesion of mist and the like to the dried substrate top surface Wf and oxidation.

When the drying of the substrate W is completed, a substrate carry-out process (Step S106) of carrying the substrate W out of the processing unit 91 is finally performed. When the substrate carry-out process is started, the control unit 97 first issues an operation command to the substrate holder 11 to stop the rotation of the substrate W. Further, the control unit 97 issues an operation command to the dry gas supply unit 53 to successively set the mass flow controllers 535, 536 at a flow rate of 0, thereby successively stopping the supply of the gas for purging and the gas for curtain. Then, the control unit 97 issues an operation command to the fluid injection unit 55 to position the head main body 561 at the distant position.

Further, the control unit 97 issues an operation command to the waste liquid collector 13 to position the cup 130 at the home position. After the rotation of the substrate W is stopped, the control unit 97 issues an operation command to the substrate holder 11 to position the spin base 113 at a position suitable for the transfer of the substrate W. After the substrate holder 11 is positioned at the position suitable for the transfer of the substrate W, the control unit 97 issues an operation command to the substrate holder 11 to set the substrate holding members 115 to the open state and place the substrate W on the substrate supporting portions.

Thereafter, the shutter 911 is opened, the center robot 96 extends the upper hand 961 into the processing unit 91, carries the substrate W out of the processing unit 91 and transfers the substrate W to the upper hand 951 of the shuttle 95. Thereafter, the shuttle 95 moves the upper hand 951 toward the indexer unit 93.

Then, the indexer robot 931 takes out the substrate W held by the upper hand 951 of the shuttle 95 by the upper hand 933 and carries it to a predetermined position of the FOUP 949, thereby finishing a series of processes.

As described above, since the nozzle 350 can scan the entire substrate top surface Wf by the swiveling movement of the nozzle 350 by the swivel driver 356 and the rotational movement of the substrate W by the substrate holder 11 in this embodiment, the directly transmitted area BE can be successively positioned on the entire substrate under surface Wb. Thus, strong ultrasonic vibration can be successively transmitted to the entire substrate under surface Wb, wherefore the substrate under surface Wb can be satisfactorily cleaned.

Specifically, in this embodiment, the ultrasonic wave applying liquid is supplied from the top surface side of the substrate where the nozzle can be relatively freely arranged and moved instead of being supplied from the under surface side of the substrate generally having a low degree of freedom in nozzle arrangement. Thus, the nozzle can scan the entire substrate top surface, thereby realizing satisfactory cleaning of the substrate under surface.

Further, since the dissolved nitrogen gas concentration of the first liquid constituting the liquid film formed on the substrate under surface Wb is increased, the cavitation intensity is higher as compared with the DIW whose dissolved nitrogen gas concentration is not increased. Thus, particles and the like can be removed with larger energy and the substrate under surface Wb can be satisfactorily cleaned.

Further, by setting the angle of incidence θ of the ultrasonic wave applying liquid on the substrate W at an optimal angle, ultrasonic vibration can be efficiently applied to the substrate W and particles and the like can be removed with larger energy, wherefore the substrate under surface Wb can be satisfactorily cleaned.

Furthermore, since the degassing process is applied to the ultrasonic wave applying liquid to be supplied to the substrate top surface Wf, the collapse of the pattern elements formed on the substrate top surface Wf can be prevented.

Second Embodiment

In the first embodiment, the nozzle 350 is relatively moved with respect to the substrate W by the swiveling of the nozzle 350 including the single discharge port 352 and the rotation of the substrate W itself. By this relative movement, the directly transmitted area BE is successively located on the entire substrate under surface Wb. There is no limitation to this in carrying out the invention and the nozzle 350 may be relatively moved with respect to the substrate W by driving only either one of the nozzle 350 and the substrate W. For example, by providing a nozzle 350 including a plurality of discharge ports 352, a plurality of directly transmitted areas BE may be created during the ultrasonic cleaning process and the plurality of directly transmitted areas BE may be moved only by the rotation of the substrate W without moving the nozzle 350 during the ultrasonic cleaning process.

<2-1. Configuration of Processing Unit>

Figure 19:
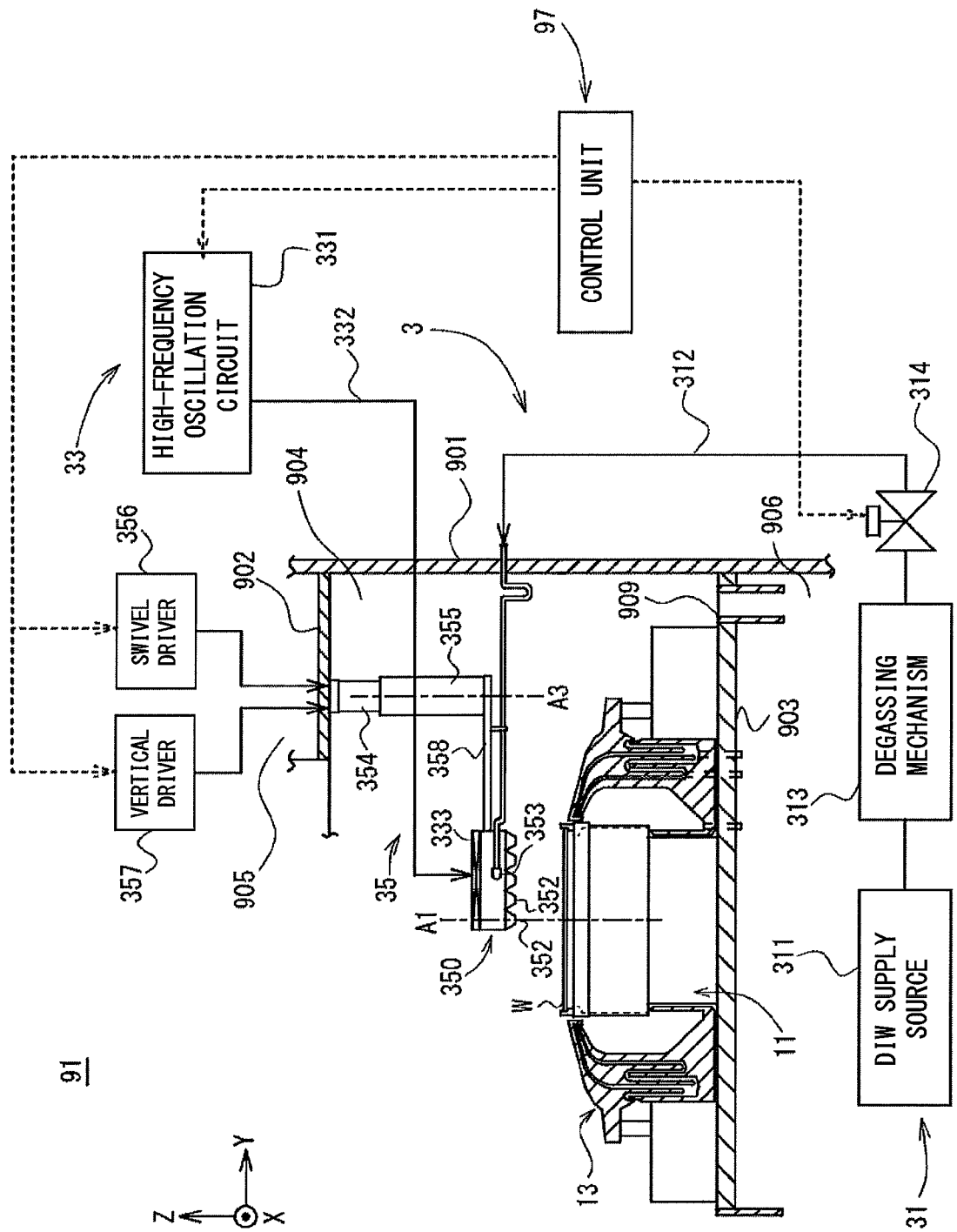
FIG. 19 is a diagram showing the configuration of the second liquid discharger in a second embodiment.

FIG. 19 shows the configuration of a second liquid discharge unit according to a second embodiment. The second embodiment differs in configuration from the first embodiment (see FIG. 9) in that a nozzle 350 includes a plurality of discharge ports 352 and is configured similarly to the first embodiment in other points. Thus, the similar configuration is not described.

The nozzle 350 in the second embodiment includes five discharge ports 352 as shown in FIG. 19. The five discharge ports 352 are aligned in a row in a radial direction of a substrate W from a rotation center axis A1 of the substrate W to the vicinity of a peripheral edge part of the substrate W.

DIW supplied from a DIW supply source 311 is introduced to each discharge port 352 via an introducing portion 353. In this embodiment, one introducing portion 353 is provided for the nozzle 350 and the DIW is supplied to the respective discharge ports 352 by unillustrated branch flow passages in a main body of the nozzle 350. Note that there is no limitation to this in carrying out the invention and a plurality of introducing portions 353 may be provided for the nozzle 350 to correspond to the number of the discharge ports 352.

Further, the nozzle 350 includes an oscillator 333. In this embodiment, one oscillator 333 as a long oscillator plate is provided and uniformly applies ultrasonic vibration to the DIW discharged from each discharge port 352. Note that there is no limitation to this in carrying out the invention and a plurality of oscillators 333 corresponding to the respective discharge ports 352 may be provided and an optimal ultrasonic wave output corresponding to the position of the substrate W may be applied by independently controlling each oscillator 333.

<2-2. Substrate Processing Processes>

Next, a substrate processing operation in a substrate processing apparatus 9 of the second embodiment configured as described above is described. Here, the substrate processing operation of the second embodiment differs from that of the first embodiment in whether or not the nozzle 350 swivels during an ultrasonic cleaning process (see FIG. 13) and the other processes are similar to those of the first embodiment. Thus, the similar processes are not described.

After a liquid film forming process (Step S103) is performed as in the first embodiment, an ultrasonic cleaning process (Step S104) of satisfactorily ultrasonically cleaning the entire substrate under surface Wb by supplying an ultrasonic wave applying liquid to a plurality of positions of the substrate top surface Wf from the plurality of discharge ports 352 of the nozzle 350 is performed in the second embodiment. At this time, although the nozzle 350 is moved along the course T1 (see FIG. 11) above the substrate top surface Wf in the first embodiment, the nozzle 350 is not moved in the second embodiment after being located at a processing position above the substrate top surface Wf.

FIG. 20 is a diagram showing states of the nozzle 350 and the substrate W in the ultrasonic cleaning process of the second embodiment when viewed from above. When the ultrasonic wave applying liquid is discharged from the plurality of discharge ports 352 of the nozzle 350, directly sprayed areas FE, which are partial areas of the substrate top surface Wf to which the ultrasonic wave applying liquid is directly discharged, are created below the respective discharge ports 352.

As shown in FIG. 20, since the substrate W is rotated by a substrate holder 11 in the ultrasonic cleaning process continually from the liquid film forming process, the partial areas serving as the directly sprayed areas FE are successively moved on the substrate top surface Wf with the rotation of the substrate W. In this way, the areas serving as the directly sprayed areas FE draw loci indicated by dotted-line arrows of FIG. 20. Thus, even if the nozzle 350 is not swiveled during ultrasonic cleaning, the directly sprayed areas FE can be located over the substantially entire substrate top surface Wf, with the result that strong ultrasonic vibration can be successively transmitted to the entire substrate under surface Wb. Thus, the substrate under surface Wb can be satisfactorily cleaned.

Here, in the invention, it is not essential to locate the directly sprayed areas FE on the entire substrate top surface Wf. If an area where ultrasonic vibration in the directly sprayed area FE is transmitted while being attenuated to half is expressed as an indirectly sprayed area, satisfactory ultrasonic cleaning can be performed on the entire substrate under surface Wb by successively locating the directly sprayed areas FE on the substrate top surface Wf so that the indirectly sprayed areas can be located on the entire substrate top surface Wf.

Since the swiveling of the nozzle 350 during the ultrasonic cleaning process is not necessary in the second embodiment, the contamination of the substrate W during the substrate processing processes can be suppressed by suppressing dirt and the like created due to swivel drive.

Further, in this embodiment, the nozzle 350 including the plurality of discharge ports 352 aligned in a row is arranged above the substrate top surface Wf. In the case of holding a substrate from an under surface side as in this embodiment, a degree of freedom in nozzle arrangement at the under surface side of the substrate is low. Thus, it is difficult to supply the ultrasonic wave applying liquid over the substantially entire principal surface of the substrate by arranging a nozzle at the under surface side of the substrate. Contrary to this, in this embodiment, the ultrasonic wave applying liquid is supplied not from the under surface side of the substrate, but from the top surface side of the substrate where the nozzle can be relatively freely arranged and moved. Thus, the shape of the nozzle used can be freely designed and the ultrasonic wave applying liquid can be supplied to the substantially entire substrate top surface, whereby satisfactory cleaning of the substrate under surface is realized.

Third Embodiment

In the first and second embodiments, ultrasonic vibration is transmitted to the substrate under surface Wb and the liquid film Lb via the substrate W by supplying the ultrasonic wave applying liquid only to the substrate top surface Wf. However, there is no limitation to the above embodiments in carrying out the invention and the ultrasonic wave applying liquid obtained by applying ultrasonic waves to the second liquid may be supplied to the substrate top surface Wf using the nozzle 350 in the first or second embodiment and a nozzle (nozzle 360) may be provided to directly supply the ultrasonic wave applying liquid to the substrate under surface Wb.

If such a configuration is adopted, ultrasonic vibration can be applied to the substrate W from both the substrate top surface Wf and the substrate under surface Wb, wherefore a particle cleaning force on the substrate under surface Wb becomes stronger and more satisfactory cleaning of the substrate under surface Wb than in the first and second embodiments is realized. A third embodiment of the invention is described below.

<3-1. Configuration of Processing Unit>

Figure 21:
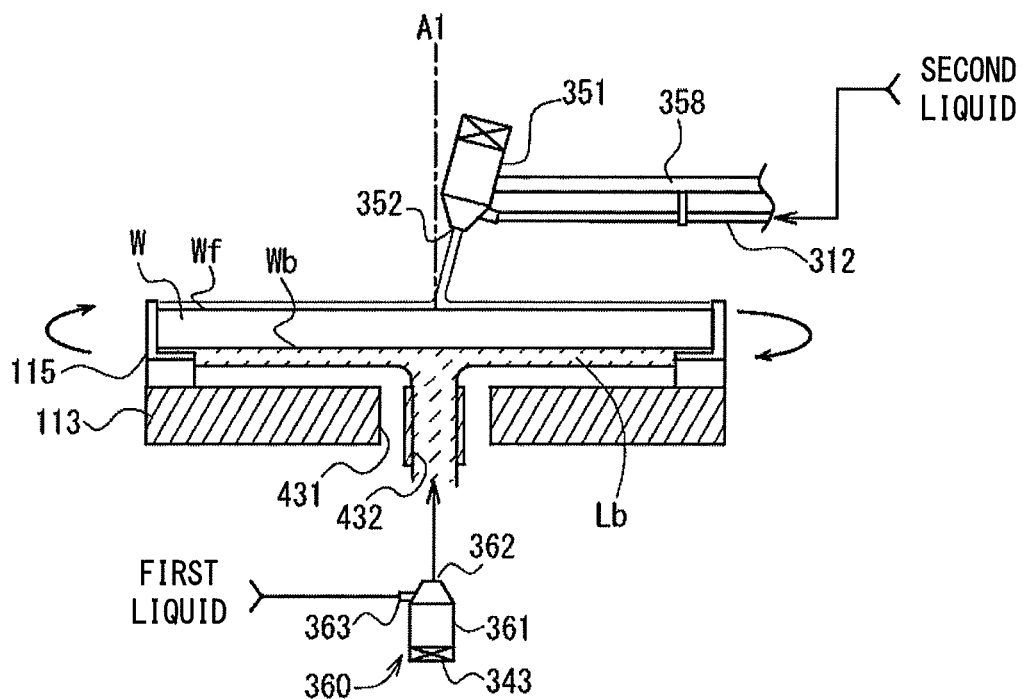
FIG. 21 is a diagram schematically showing a peripheral configuration of a substrate according to a third embodiment.

A schematic configuration of a processing unit 91 according to the third embodiment is described using FIG. 21. FIG. 21 is a diagram schematically showing a peripheral configuration of a substrate W according to the third embodiment. The third embodiment differs in configuration from the first embodiment (see FIG. 14) in that a nozzle 360 is newly provided in addition to a nozzle 350 and is configured similarly to the first embodiment in other points. Thus, the similar configuration is not described.

In the third embodiment, the nozzle 360 for discharging an ultrasonic wave applying liquid obtained by applying ultrasonic waves to a first liquid (hereinafter, referred to as an ultrasonic wave applying first liquid in this embodiment) toward a substrate under surface Wb is further provided in the substrate processing unit 91 of the first embodiment. The nozzle 360 includes a nozzle main body 361, an introducing portion 363 for introducing the first liquid into the nozzle main body 361, a discharge port 362 for discharging the first liquid in the nozzle main body 361 toward the substrate under surface Wb and an oscillator 343 for applying ultrasonic waves to the first liquid in the nozzle main body 361.

The nozzle 360 is configured substantially similarly to the nozzle 350. The nozzle 350 is supported on an arm 358, whereas the nozzle 360 is fixed to a lower base member 903 in a lower space 906 (see FIG. 4). Note that there is no limitation to this in carrying out the invention and the nozzle 360 may be provided in a substrate holder 11 or may be fixed to a member other than the lower base member 903 in the lower space 906.

The introducing portion 363 is connected to a pipe 412 of a first liquid supply unit 41 (see FIG. 7). When an on-off valve 414 is opened in response to an operation command of a control unit 97, the first liquid obtained by increasing a dissolved nitrogen gas concentration of DIW supplied from a DIW supply source 411 in a gas concentration adjusting mechanism 413 is introduced to the introducing portion 363 via the pipe 412.

The oscillator 343 is connected to a high-frequency oscillation circuit 331 in an ultrasonic wave applying unit 33 (see FIG. 9) by an unillustrated wire and ultrasonic waves are applied to the first liquid introduced into the nozzle main body 361 from the introducing portion 363 based on a high-frequency signal from the high-frequency oscillation circuit 331.

Note that although the oscillator 343 oscillates upon receiving a high-frequency signal from the high-frequency oscillation circuit 331 similarly to an oscillator 333 in the third embodiment, there is no limitation to this in carrying out the invention and a high-frequency oscillation circuit may be prepared to oscillate the oscillator 343 separately from that for the oscillator 333.

The discharge port 362 is connected to an inner pipe 432. When being discharged from the discharge port 362, the first liquid is supplied to a central part of the substrate under surface Wb via the inner pipe 432. By the above, the nozzle 360 constitutes an "ultrasonic wave applying first liquid discharger" for discharging the ultrasonic wave applying first liquid obtained by applying ultrasonic waves to the first liquid obtained by dissolving nitrogen gas in the DIW to the substrate under surface Wb.

<3-2. Substrate Processing Processes>

Next, a substrate processing operation in a substrate processing apparatus 9 of the third embodiment configured as described above is described using the flow chart of FIG. 13 and the diagram of FIG. 21. Here, the substrate processing operation of the third embodiment differs from that of the first embodiment in whether or not the nozzle 360 applies ultrasonic waves to the first liquid during an ultrasonic cleaning process and the other processes are similar to those of the first embodiment. Thus, the similar processes are not described.

After the substrate processing operation is performed up to a substrate top surface cleaning process (Step S102) as in the first embodiment, the first liquid is supplied to the substrate under surface Wb from the first liquid supply unit 41 through the inner tube 432 by way of the nozzle 360 to form a liquid film Lb (see FIG. 21) in a liquid film forming process (Step S103) in the third embodiment. A difference from the first embodiment is whether or not the first liquid is supplied by way of the nozzle 360 (i.e. whether or not the first liquid is introduced to the nozzle main body 361 from the introducing portion 363 and discharged from the discharge port 362) and the liquid film forming process of the third embodiment is similar to that of the first embodiment in other points. Note that ultrasonic waves are not applied to the first liquid by the oscillator 343 in the liquid film forming process.

When the liquid film Lb is formed on the substrate under surface Wb, an ultrasonic cleaning process (Step S104) is performed next. In the ultrasonic cleaning process, the nozzle 350 scans the substrate top surface Wf along a course T1 (see FIG. 11) while supplying an ultrasonic wave applying liquid (hereinafter, referred to as an ultrasonic wave applying second liquid in this embodiment) obtained by applying ultrasonic waves to a second liquid by the oscillator 333 in the nozzle 350 to the substrate top surface Wf from a discharge port 352 as in the first embodiment, whereby a directly sprayed area FE is located on the substantially entire surface of the substrate W. In this way, ultrasonic vibration is evenly transmitted to the substrate under surface Wb and the liquid film Lb via the substrate W, thereby removing particles and the like on the substrate under surface Wb.

In the third embodiment, the ultrasonic wave applying first liquid obtained by applying ultrasonic waves to the first liquid by the oscillator 343 in the nozzle 360 provided below the substrate W is supplied to the substrate under surface Wb from the discharge port 362. In this way, ultrasonic vibration applied by the ultrasonic wave applying second liquid and ultrasonic vibration applied by the ultrasonic wave applying first liquid are superimposed in the liquid film Lb formed by the ultrasonic wave applying first liquid and stronger vibration is applied to particles and the like. By supplying the liquid applied with ultrasonic waves to both the substrate top surface Wf and the substrate under surface Wb, particles and the like can be more satisfactorily removed from the substrate under surface Wb.

Fourth Embodiment

In the above third embodiment, the nozzle 360 is connected to the inner pipe 432 of the under surface discharge unit 43 and the ultrasonic wave applying first liquid obtained by applying ultrasonic waves to the first liquid is discharged to the central part of the substrate under surface Wb. However, there is no limitation to this in carrying out the invention and a nozzle for discharging a liquid applied with ultrasonic waves toward the peripheral edge part of the substrate W or the substrate under surface Wb may be disposed outwardly of the substrate W in a radial direction from the center toward the peripheral edge part of the substrate W and below the substrate W and the ultrasonic wave applying liquid may be supplied obliquely from below the substrate W.

If such a configuration is adopted, ultrasonic vibration can be applied to both the substrate top surface Wf and the substrate under surface of the substrate W. Thus, a particle cleaning force on the substrate under surface Wb becomes stronger and more satisfactory cleaning of the substrate under surface Wb than in the first and second embodiments is realized.

Further, in the third embodiment, the nozzle 360 needs to be arranged in a limited space such as the substrate holder 11 and an arrangement may be difficult depending on the apparatus configuration. Contrary to this, in a fourth embodiment, since a nozzle 360 has only to be disposed outwardly of the substrate W in the radial direction from the center toward the peripheral edge part of the substrate W and below the substrate W in a processing unit 91, this embodiment can be carried out even if the nozzle 360 cannot be disposed in the substrate holder 11 as described above. The fourth embodiment of the invention is described below.

<4-1. Configuration of Processing Unit>

A schematic configuration of the processing unit 91 according to the fourth embodiment is described using FIG. 22. FIG. 22 is a diagram schematically showing a peripheral configuration of a substrate W according to the fourth embodiment. The fourth embodiment differs in configuration from the first embodiment (see FIG. 14) in that the nozzle 360 is newly provided in addition to a nozzle 350 and is configured similarly to the first embodiment in other points. Thus, the similar configuration is not described.

In the fourth embodiment, the nozzle 360 for discharging an ultrasonic wave applying liquid obtained by applying ultrasonic waves to a first liquid (hereinafter, referred to as an ultrasonic wave applying first liquid in this embodiment) toward a substrate under surface Wb or a peripheral edge part of the substrate W is further provided in the substrate processing unit 91 of the first embodiment. The nozzle 360 includes a nozzle main body 361, an introducing portion 363 for introducing the first liquid into the nozzle main body 361, a discharge port 362 for discharging the first liquid in the nozzle main body 361 toward the substrate under surface Wb and an oscillator 343 for applying ultrasonic waves to the first liquid in the nozzle main body 361.

The nozzle 360 is configured substantially similarly to the nozzle 350. The nozzle 350 is supported on an arm 358, whereas the nozzle 360 is arranged on an outer constituent member 135 of a cup 130. An arrangement described, for example, in JP2010-27816A can be used as a specific arrangement of such a nozzle 360. Note that there is no limitation to this in carrying out the invention and the nozzle 360 may be vertically swivelably provided in the processing unit 91 by an arm or the like similarly to the nozzle 350.

In the fourth embodiment, one end of a pipe 412 of a first liquid supply unit 41 (see FIG. 7) is connected to a DIW supply source 411 and an on-off valve 414 and the opposite other end is branched into two parts, one being connected to an inner pipe 432 as in the first embodiment and the other being connected to the introducing portion 363 of the nozzle 360 in this embodiment as shown in FIG. 22. Further, an unillustrated on-off valve for controlling the discharge of the first liquid from the nozzle 360 is provided in a branch pipe on the size of the nozzle 360. This on-off valve is electrically connected to a control unit 97 and controllably opened and closed in response to an operation command of the control unit 97.

The introducing portion 363 is connected to one of the branch pipes of the pipe 412. When the on-off valve 414 is opened in response to an operation command of the control unit 97, the first liquid obtained by increasing a dissolved nitrogen gas concentration of DIW supplied from the DIW supply source 411 in the gas concentration adjusting mechanism 413 is supplied to the inner pipe 432 via the pipe 412. Further, when the on-off valve (not shown) in the branch pipe on the side of the nozzle 360 is opened in response to an operation command of the control unit 97, the first liquid is introduced also to the introducing portion 363.

The oscillator 343 is connected to a high-frequency oscillation circuit 331 in an ultrasonic wave applying unit 33 (see FIG. 9) by an unillustrated wire and ultrasonic waves are applied to the first liquid introduced into the nozzle main body 361 from the introducing portion 363 based on a high-frequency signal from the high-frequency oscillation circuit 331.

Note that although the oscillator 343 oscillates upon receiving a high-frequency signal from the high-frequency oscillation circuit 331 similarly to the oscillator 333 in the fourth embodiment, there is no limitation to this in carrying out the invention and a high-frequency oscillation circuit may be prepared to oscillate the oscillator 343 separately from that for the oscillator 333.

The discharge port 362 is open toward a peripheral edge part of the substrate under surface Wb. When being discharged from the discharge port 362, the first liquid is supplied to the substrate under surface Wb from the outside of the substrate W in the radial direction from the center toward the peripheral edge part of the substrate W through a clearance between a spin base 113 and the substrate W as show in FIG. 22. By the above, the nozzle 360 constitutes an "ultrasonic wave applying first liquid discharger" for discharging the ultrasonic wave applying first liquid obtained by applying ultrasonic waves to the first liquid obtained by dissolving nitrogen gas in the DIW to the substrate under surface Wb (or the vicinity of the peripheral edge part of the substrate under surface Wb) from the outside of the substrate W in the radial direction from the center toward the peripheral edge part of the substrate W.

<4-2. Substrate Processing Processes>

Next, a substrate processing operation in a substrate processing apparatus 9 of the fourth embodiment configured as described above is described using the flow chart of FIG. 13 and the diagram of FIG. 22. Here, the substrate processing operation of the fourth embodiment differs from that of the first embodiment in whether or not the ultrasonic wave applying first liquid is discharged from the nozzle 360 during an ultrasonic cleaning process and the other processes are similar to those of the first embodiment. Thus, the similar processes are not described.

After the substrate processing operation is performed up to a substrate top surface cleaning process (Step S102) as in the first embodiment, the first liquid is supplied to the substrate under surface Wb from the first liquid supply unit 41 through the inner pipe 432 to form a liquid film Lb (see FIG. 22) in a liquid film forming process (Step S103) in the fourth embodiment. Note that, in the liquid film forming process in the fourth embodiment, the on-off valve (not shown) in the branch pipe on the side of the nozzle 360 is closed and the first liquid is not introduced to the introducing portion 363.

When the liquid film Lb is formed on the substrate under surface Wb, an ultrasonic cleaning process (Step S104) is performed next. In the ultrasonic cleaning process, the nozzle 350 scans the substrate top surface Wf along a course T1 (see FIG. 11) while supplying an ultrasonic wave applying liquid (hereinafter, referred to as an ultrasonic wave applying second liquid in this embodiment) obtained by applying ultrasonic waves to a second liquid by the oscillator 333 in the nozzle 350 to the substrate top surface Wf from a discharge port 352 as in the first embodiment, whereby a directly sprayed area FE is located on the substantially entire surface of the substrate W. In this way, ultrasonic vibration is evenly transmitted to the substrate under surface Wb and the liquid film Lb via the substrate W, thereby removing particles and the like on the substrate under surface Wb.

In the fourth embodiment, the ultrasonic wave applying first liquid obtained by applying ultrasonic waves to the first liquid by the oscillator 343 in the nozzle 360 provided obliquely below the substrate W is supplied to the substrate under surface Wb from the discharge port 362.

Specifically, after the on-off valve (not shown) in the branch pipe on the side of the nozzle 360 is opened in response to an operation command of the control unit 97 and the first liquid is introduced to the introducing portion 363, ultrasonic waves are applied to the first liquid by the oscillator 343 to obtain the ultrasonic wave applying first liquid and the ultrasonic wave applying first liquid is discharged toward the substrate under surface Wb from the discharge port 362.

In this way, ultrasonic vibration applied by the ultrasonic wave applying second liquid and ultrasonic vibration applied by the ultrasonic wave applying first liquid are superimposed in the liquid film Lb formed by the first liquid supplied from the inner pipe 432 and stronger vibration is applied to particles and the like. By supplying the liquid applied with ultrasonic waves to both the substrate top surface Wf and the substrate under surface Wb, particles and the like can be more satisfactorily removed from the substrate under surface Wb.

Fifth Embodiment

In the first to fourth embodiments, the DIW is used for both the first and second liquids and the magnitude of the cavitation intensity is adjusted by performing the process of increasing the dissolved nitrogen gas concentration and the degassing process. In the invention, only the degassing process for the second liquid may be performed without adjusting the dissolved nitrogen gas concentration of the first liquid to be supplied to the substrate under surface Wb if the substrate under surface Wb is sufficiently cleaned such as by the entire surface scanning of the nozzle 350.

In the fifth embodiment, DIW supplied from a DIW supply source 411 is used as it is without increasing a nitrogen gas concentration thereof by a gas concentration adjusting mechanism 413. In this case, the gas concentration adjusting mechanism 413 may not be provided at all.

Further, nitrogen gas may be dissolved in the DIW stored in the DIW supply source 411 from the beginning or functional water such as carbonated water dissolved with carbon dioxide or hydrogen water dissolved with hydrogen may be used by being stored in the DIW supply source 411. Specifically, even if a liquid having the same composition (DIW) is used as the "first liquid" and the "second liquid" of the invention, the above functions and effects can be obtained by setting a gas concentration in the "second liquid" lower than that in the "first liquid". Further, this is not limited to the DIW and the same holds true also for liquids mainly containing isopropyl alcohol (IPA), ethanol and hydrofluoroether and cleaning liquids generally used for substrate cleaning such as SC-1.

Sixth Embodiment

In the first to fourth embodiment, the DIW is used for both the first and second liquids and the magnitude of the cavitation intensity is adjusted by performing the process of increasing the dissolved nitrogen gas concentration and the degassing process. In the invention, the adjustment of the magnitude of the cavitation intensity is not limited to the adjustment of the dissolved gas concentration and may be achieved by changing the compositions of liquids used for the first and second liquids.

Specifically, liquids having mutually different compositions may be used as the "first liquid" and the "second liquid" of the invention and functions and effects similar to those of the first embodiment are obtained by setting the cavitation intensity of the "second liquid" lower than that of the "first liquid".

Although the degassed DIW is used as the second liquid (cavitation suppressing liquid) in the first embodiment, there is no limitation to this and a liquid having a cavitation intensity lower than a liquid film Lb formed on a substrate under surface Wb can be used as the second liquid. Specifically, a liquid having a large cavitation coefficient $\alpha$ and/or small bubble collapse energy U is preferably used as the second liquid for suppressing cavitation. Here, if the cavitation coefficient $\alpha$ and the bubble collapse energy U of the DIW are "1", those of IPA, HFE7300, HFE7100 are as in the following Table 1. Note that HFE7300 and HFE7100 respectively mean Novec (registered trademark) 7300, 7100 produced by 3M Japan Limited.

TABLE 1

| LIQUID | CAVITATION COEFFICIENT $\alpha$ | BUBBLE COLLAPSE ENERGY U |
|---|---|---|
| DIW | 1 | 1 |
| IPA | 1.2 | 0.03 |
| HFE7300 | 0.5 | 0.01 |
| HFE7100 | 0.6 | 0.01 |

For example, the cavitation coefficient $\alpha$ of IPA is larger than that of the DIW and the bubble collapse energy U thereof is drastically smaller than that of the DIW. Thus, IPA or a mixed liquid of IPA and DIW can be preferably used as the second liquid (cavitation suppressing liquid). Further, since IPA and the above mixed liquid are so-called low surface tension liquids, these are desirable also in effectively preventing pattern collapse by supplying these to the substrate top surface Wf such as when the pattern elements are not covered by an ultrasonic cleaning liquid during the swiveling movement of the nozzle 350 in the ultrasonic cleaning process.

<Modifications>

Note that the invention is not limited to the aforementioned embodiments and various changes other than the aforementioned ones can be made without departing from the gist of the invention.

In the first embodiment, the substrate W is held in a horizontal posture by the substrate holder 11. Here, holding in the horizontal posture is not limited to holding in a posture where the substrate is perfectly parallel to the XY plane in FIG. 4 and perpendicular to the Z direction (i.e. vertical direction) and includes holding in a posture inclined by a tiny angle from a posture perpendicular to the Z direction. Such a tiny inclination (e.g. inclination of 3° with respect to the XY plane) is substantially horizontal. Further, in forming the liquid film Lb on the substrate under surface Wb, the invention can be carried out even if the substrate W is inclined by this small angle.

Although the nozzle 350 including the plurality of discharge ports 352 (see FIG. 19) is used in the second embodiment, there is no limitation to this in carrying out the invention and a plurality of nozzles 350 including a single discharge port 352 may be respectively supported on the separate arm 358, rotational swivel shaft 355 and base member 354. By adopting such a configuration, a plurality of directly sprayed areas FE and a plurality of directly transmitted areas BE can be created at different positions on the substrate W, and an improvement in the cleaning force for the substrate under surface Wb in the ultrasonic cleaning process and the shortening of the process time resulting from the shortening of the scanning time of the nozzle 350 are expected.

In the invention, the nozzle for supplying the ultrasonic wave applying liquid to the one principal surface may be configured to relatively move with respect to the one principal surface while discharging the ultrasonic wave applying liquid in the ultrasonic cleaning process of the substrate cleaning method according to the invention. This enables a satisfactory cleaning process to be performed on the entire substrate under surface.

The substrate cleaning method according to the invention may further include a substrate rotating process of rotating the substrate held in the substrate holding process about a center of rotation, the liquid film may be formed by supplying the first liquid to the other principal surface while the substrate being rotated by the substrate rotating process in the liquid film forming process and the ultrasonic wave applying liquid may be supplied to the one principal surface while the substrate being rotated by the substrate rotating process in the ultrasonic cleaning process.

In the ultrasonic cleaning process of the substrate cleaning method according to the invention, the ultrasonic wave applying liquid may be supplied to the one principal surface while the substrate being rotated by the substrate rotating process and the ultrasonic wave applying first liquid obtained by applying ultrasonic waves to the first liquid may be supplied to the other principal surface.

In the ultrasonic cleaning process of the substrate cleaning method according to the invention, a liquid having the same composition as the first liquid and having a lower gas concentration than the first liquid may be used as the second liquid.

The ultrasonic cleaning process of the substrate cleaning method according to the invention may include a process of degassing the second liquid and reducing the cavitation intensity of the second liquid before the second liquid is supplied to the one principal surface.

The second liquid discharger of the substrate cleaning apparatus according to the invention may include a nozzle for directly discharging the ultrasonic wave applying liquid to a partial area of the one principal surface and the nozzle may relatively move with respect to the substrate. This enables a satisfactory cleaning process to be performed on the entire substrate under surface.

The substrate cleaning apparatus according to the invention may further include a substrate rotator for rotating the substrate held by the substrate holder about a center of rotation, the second liquid discharger may include a moving mechanism for relatively moving the nozzle with respect to the substrate, and the moving mechanism may move the nozzle in a radial direction from the center of rotation of the substrate toward a peripheral edge part of the substrate between a first position where the ultrasonic wave applying liquid is discharged toward the center of rotation of the substrate and a second position where the ultrasonic wave applying liquid is discharged toward the peripheral edge part of the substrate.

The substrate cleaning apparatus according to the invention may further include an ultrasonic wave applying first liquid discharger for discharging an ultrasonic wave applying first liquid obtained by applying ultrasonic waves to the first liquid toward the other principal surface.

The nozzle of the substrate cleaning apparatus according to the invention may include a nozzle main body with a discharge port open toward the one principal surface and configured to discharge the ultrasonic wave applying liquid, an introducing portion for introducing the liquid into the nozzle main body and an oscillator for producing the ultrasonic wave applying liquid by applying ultrasonic waves to the liquid introduced into the nozzle main body, and the oscillator may have a concave surface facing the discharge port and converge the ultrasonic waves included in the ultrasonic wave applying liquid outside the discharge port.

The substrate cleaning apparatus according to the invention may further include a position adjuster for adjusting the position of a convergence point where the ultrasonic waves included in the ultrasonic wave applying liquid converge and a direction adjuster for adjusting an angle of incidence of the ultrasonic wave applying liquid on the one principal surface.

The second liquid discharger of the substrate cleaning apparatus according to the invention may include a degassing mechanism for degassing the second liquid and produce the ultrasonic wave applying liquid by applying ultrasonic waves to the second liquid degassed by the degassing mechanism.

The first liquid discharger of the substrate cleaning apparatus according to the invention may include a gas concentration adjusting mechanism for increasing a gas concentration in the first liquid by dissolving nitrogen gas, carbon dioxide, hydrogen gas, oxygen gas, ozone gas or air in the first liquid and discharge the first liquid whose gas concentration is increased by the gas concentration adjusting mechanism to the other principal surface.

This invention is suitable for a substrate cleaning technology of cleaning another principal surface of a substrate having pattern elements formed on one principal surface.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A substrate cleaning method of cleaning a substrate that has one principal surface on which pattern elements are formed and another principal surface to be cleaned, the method comprising:
   a substrate holding process of holding the substrate horizontally with the other principal surface faced vertically downward, wherein the other principal surface is opposite the one principal surface;

a liquid film forming process of forming a liquid film by supplying a first liquid to the other principal surface;

an ultrasonic wave cleaning process of ultrasonically cleaning the other principal surface by supplying an ultrasonic wave applying liquid to the one principal surface while the liquid film is on the other principal surface and transmitting ultrasonic vibration from the one principal surface to the other principal surface and the liquid film of the first liquid formed on the other principal surface via the substrate, the ultrasonic wave applying liquid being obtained by applying ultrasonic waves to a second liquid;

wherein the first liquid has a higher cavitation intensity, which is a stress per unit area acting on the substrate by cavitation, than the second liquid;

further comprising a substrate rotating process of rotating the substrate held by the substrate holding process about a center of rotation, wherein:

the liquid film is formed by supplying the first liquid to the other principal surface while the substrate is being rotated by the substrate rotating process during the liquid film forming process;

the ultrasonic wave applying liquid is supplied to the one principal surface while the substrate is being rotated by the substrate rotating process during the ultrasonic cleaning process;

wherein, during the ultrasonic cleaning process, the ultrasonic wave applying liquid is supplied to the one principal surface and an ultrasonic wave applying first liquid obtained by applying ultrasonic waves to the first liquid is supplied to the other principal surface while the substrate is being rotated by the substrate rotating process, and wherein the ultrasonic wave applying first liquid is applied to the other principal surface by a nozzle that is located outside the diameter of the substrate and that ejects the ultrasonic wave applying first liquid towards a peripheral edge of the other principal surface.

2. The substrate cleaning method according to claim 1, wherein a nozzle for supplying the ultrasonic wave applying liquid to the one principal surface relatively moves with respect to the one principal surface while discharging the ultrasonic wave applying liquid in the ultrasonic cleaning process.

3. The substrate cleaning method according to claim 1, wherein a liquid having the same composition as the first liquid and a lower gas concentration than the first liquid is used as the second liquid in the ultrasonic cleaning process.

4. The substrate cleaning method according to claim 3, wherein the ultrasonic cleaning process includes a process of degassing the second liquid to reduce the cavitation intensity of the second liquid before the second liquid is supplied to the one principal surface.

* * * * *